(12) United States Patent
Reed

(10) Patent No.: US 6,201,779 B1
(45) Date of Patent: Mar. 13, 2001

(54) MEEPR4 SAMPLED AMPLITUDE READ CHANNEL FOR DISK STORAGE SYSTEMS

(75) Inventor: David E. Reed, Westminster, CO (US)

(73) Assignee: Cirrus Logic, Inc., Austin, TX (US)

(*) Notice: Subject to any disclaimer, the term of this patent is extended or adjusted under 35 U.S.C. 154(b) by 0 days.

(21) Appl. No.: 09/107,715

(22) Filed: Jun. 30, 1998

(51) Int. Cl.$^7$ .............................. G11B 7/00; G11B 5/09
(52) U.S. Cl. .............................................. 369/59; 360/46
(58) Field of Search .................................. 369/59, 48, 47; 360/41, 46, 53, 51

(56) References Cited

U.S. PATENT DOCUMENTS

| | | | |
|---|---|---|---|
| 5,291,499 | 3/1994 | Behrens et al. | 371/43 |
| 5,424,881 | 6/1995 | Behrens et al. | 360/40 |
| 5,617,573 | 4/1997 | Huang et al. | 395/376 |
| 5,760,984 | 6/1998 | Spurbeck et al. | 360/51 |
| 6,009,549 | * 12/1999 | Bliss et al. | 360/51 |
| 6,023,386 | * 2/2000 | Reed et al. | 360/51 |
| 6,032,284 | * 2/2000 | Bliss | 360/51 |

OTHER PUBLICATIONS

S. Benedetto, M. Mondin, G. Montorsi, "Performance Evaluation of Trellis–Coded Modulation Schemes", *Proceedings of the IEEE*, vol. 82, No. 6, Jun. 1994.

P. A. McEwen and J. K. Wolf, "Trellis Codes for (1,k) E$^2$PR4ML with Squared Distance 18", *IEEE Transactions on Magetics*, vol. 32, No. 5, Sep. 1996.

Mysor R. Raghuveer et al., "Coding for Higher Order Partial Response Channels", *Coding and Signal Processing for Information Storage*, SPIE Proceedings, vol. 2605, Oct. 23–24, 1995, Philadelphia, Penn.

W. G. Bliss and D. E. Reed, "Analysis of HDD thin–film read channel performance as a function of media thickness and RLL code d constraint", *1996 Digests of Intermag '96*, Apr. 9–12, 1996, Seattle, Washington.

K. Shimoda et al., "New Type (1,7) RLL Partial Response over 5 Gbit/in$^2$ Areal Density", *IEEE Transacations on Magentics*, vol. 33, No. 5, Sep. 1997.

B. H. Marcus, P. H. Siegel, J. K. Wolf, "Finite–State Modulation Codes for Data Storage", *IEEE Journal on Selected Areas in Communications*, vol. 10, No. 1, Jan. 1992.

J. K. Moon and B. Brickner, "Maximum Transition Run Codes for Data Storage Systems", *1996 Digests of Intermag '96*, Apr. 9–12, 1996, Seattle, Washington.

P. H. Siegel and J. K. Wolf, "Modulation Coding for Information Storage", *IEEE Communications Magazine*, Dec. 1991.

Stephen B. Wicker, *Error Control Systems for Digital Communication and Storage*, Prentice Hall, pp. 290–332, 1995.

* cited by examiner

Primary Examiner—Nabil Hindi
(74) Attorney, Agent, or Firm—Howard H. Sheerin; Dan A. Shifrin

(57) ABSTRACT

A sampled amplitude read channel is disclosed for disk storage systems comprising an MEEPR4 equalizer, an MEEPR4 sequence detector matched to an RLL d=1 constraint, and an encoder/decoder for implementing a channel code that codes out (2,4,2) quasi-catastrophic data sequences. A rate n/m finite state encoder encodes n bits of user data into m bits of write data, and a sliding block decoder decodes m bits of read data into n bits of estimated user data. The encoder uses the current n bits of user data as well as a current state of a state machine to generate the m bits of write data, where a state-splitting technique is employed to achieve a high code rate in a practical, cost effective implementation. The decoder decodes the m bits of read data into the n bits of estimated user data by evaluating the current detected codeword in context with the following detected codeword. In this manner, the decoder processes at most two detected codewords at a time; an error in any one detected codeword will propagate to at most three decoded symbols of estimated user data, or equivalently, it will affect at most one symbol per codeword in a three-way interleaved ECC system. Matching the sequence detector's state transition diagram to an RLL d=1 constraint enhances performance by coding out certain minimum distance error events; furthermore, it reduces the cost and complexity by eliminating the states and branches that correspond to the d=1 constraint.

27 Claims, 12 Drawing Sheets

MEEPR4 SAMPLED AMPLITUDE READ CHANNEL FOR DISK STORAGE SYSTEMS

CROSS REFERENCE TO RELATED APPLICATIONS AND PATENTS

This application is related to other U.S. patent applications, namely U.S. Pat. No. 6,052,248 entitled "A PARITY CHANNEL CODE FOR ENHANCING THE OPERATION OF A REMOD/DEMOD SEQUENCE DETECTOR IN A D=1 SAMPLED AMPLITUDE READ CHANNEL," U.S. Pat. No. 5,966,415 entitled "ADAPTIVE EQUALIZATION IN A SUB-SAMPLED READ CHANNEL FOR DISK STORAGE SYSTEMS," U.S. Pat. No. 5,966,415 entitled "A SAMPLED AMPLITUDE READ/WRITE CHANNEL EMPLOYING A SUB-BAUD RATE WRITE CLOCK." This application is also related to several U.S. patents, namely U.S. Pat. No. 5,359,631 entitled "TIMING RECOVERY CIRCUIT FOR SYNCHRONOUS WAVEFORM SAMPLING," U.S. Pat. No. 5,291,499 entitled "METHOD AND APPARATUS FOR REDUCED-COMPLEXITY VITERBI-TYPE SEQUENCE DETECTORS," U.S. Pat. No. 5,297,184 entitled "GAIN CONTROL CIRCUIT FOR SYNCHRONOUS WAVEFORM SAMPLING," U.S. Pat. No. 5,696,639 entitled "SAMPLED AMPLITUDE READ CHANNEL EMPLOYING INTERPOLATED TIMING RECOVERY," and U.S. Pat. No. 5,424,881 entitled "SYNCHRONOUS READ CHANNEL." All of the above-named patent applications and patents are assigned to the same entity, and all are incorporated herein by reference.

FIELD OF INVENTION

The present invention relates to the recording and reproduction of binary data in storage systems for digital computers (such as magnetic and optical disk drives), particularly to an MEEPR4 sampled amplitude read channel that employs a (2,4,2) d=1 encoder/decoder for coding out (2,4,2) quasi-catastrophic data sequences and certain minimum distance error events.

BACKGROUND OF THE INVENTION

In computer storage devices, such as optical and magnetic disk drives, sampled amplitude read channels employing partial response (PR) signaling with maximum likelihood (ML) sequence detection have provided a substantial increase in storage capacity by allowing for significantly higher linear bit densities. Partial response signaling refers to a particular method for transmitting symbols represented as analog pulses through a communication medium. The benefit is that at the signaling instances (baud rate) there is no intersymbol interference (ISI) from other pulses except for a controlled amount from immediately adjacent, overlapping pulses. Allowing the pulses to overlap in a controlled manner leads to an increase in the symbol rate (linear recording density) without sacrificing performance in terms of signal-to-noise ratio (SNR).

Partial response channels are characterized by the polynomials $$(1-D)(1+D)^n$$

where D represents a delay of one symbol period and n is an integer. For n=1,2,3, the partial response channels are referred to as PR4, EPR4 and EEPR4, respectively, where the frequency responses for the PR4 and EEPR4 channels are shown in FIG. 1A. The channel's dipulse response, the response to an isolated symbol, characterizes the transfer function of the system (the output for a given input). With a binary "1" bit modulating a positive dipulse response and a binary "0" bit modulating a negative dipulse response, the output of the channel is a linear combination of time shifted dipulse responses. The dipulse response for a PR4 channel $(1-D^2)$ is shown as a solid line in FIG. 1B. Notice that at the symbol instances (baud rate), the dipulse response is zero except at times t=0 and t=2. Thus, the linear combination of time shifted PR4 dipulse responses will result in zero ISI at the symbol instances except where immediately adjacent pulses overlap.

It should be apparent that the linear combination of time delayed PR4 dipulse responses will result in a channel output of +2, 0, or −2 at the symbol instances depending on the binary input sequence. The output of the channel can therefore be characterized as a state machine driven by the binary input sequence and, conversely, the input sequence can be estimated or demodulated by running the signal samples at the output of the channel through an "inverse" state machine. Because noise will obfuscate the signal samples, the inverse state machine is actually implemented as a trellis sequence detector which computes a most likely input sequence associated with the signal samples.

Operation of a PR4 trellis sequence detector is understood from its state transition diagram shown in FIG. 2A. Each state 100 is represented by the last two input symbols (in NRZ after preceding), and each branch from one state to another is labeled with the current input symbol in NRZ 102 and the corresponding sample value 104 it will produce during readback. The demodulation process of the PR4 sequence detector is understood by representing the state transition diagram of FIG. 2A as a trellis diagram shown in FIG. 2B. The trellis diagram represents a time sequence of sample values and the possible recorded input sequences that could have produced the sample sequence. For each possible input sequence, an error metric is computed relative to a difference between the sequence of expected sample values that would have been generated in a noiseless system and the actual sample values output by the channel. For instance, a Euclidean metric is computed as the accumulated square difference between the expected and actual sample values. The input sequence that generates the smallest Euclidean metric is the most likely sequence to have created the actual sample values; this sequence is therefore selected as the output of the sequence detector.

To facilitate the demodulation process, the sequence detector comprises path memories for storing each of the possible input sequences and a corresponding metric. A well known property of the sequence detector is that the paths storing the possible input sequences will "merge" into a most likely input sequence after a certain number of sample values are processed, as long as the input sequence is appropriately constrained. In fact, the maximum number of path memories needed equals the number of states in the trellis diagram; the most likely input sequence will always be represented by one of these paths, and these paths will eventually merge into one path (i.e., the most likely input sequence) after a certain number of sample values are processed.

The "merging" of path memories is understood from the trellis diagram of FIG. 2B where the "survivor" sequences are represented as solid lines. Notice that each state in the trellis diagram can be reached from one of two states; that is, there are two transition branches leading to each state. With each new sample value, the Viterbi algorithm recursively computes a new error metric and retains a single survivor sequence for each state corresponding to the minimum error metric. In other words, the Viterbi algorithm will select one of the two input branches into each state since only one of the branches will correspond to the minimum error metric, and the paths through the trellis corresponding to the branches not selected will merge into the paths that were selected. Eventually, all of the survivor sequences will merge into one path through the trellis which represents the most likely estimated data sequence to have generated the sample values as shown in FIG. 2B.

In some cases, if the input sequence is not appropriately constrained through the use of a channel code, the path memories will not merge into one survivor sequence. Consider the PR4 trellis shown in FIG. 2B; an input sequence of all zeros or all ones will prevent the paths from merging which leads to multiple possible survivor sequences output by the detector. Data sequences which prevent the path memories from merging are referred to as "quasi-catastrophic" data sequence since they result in quasi-catastrophic errors in the output sequence. In order to avoid quasi-catastrophic errors, a channel code is typically employed which codes out of the recorded data all sequences which can prevent the path memories from merging.

Even if the quasi-catastrophic data sequences are coded out of the input sequence, the sequence detector can still make an error in detecting the output sequence if enough destructive noise is present in the read signal. The possible output sequences are different from one another by a minimum Euclidean distance; a detection error typically occurs when the signal noise breaches this minimum distance between valid output sequences. FIGS. 3A–3D illustrate the sample error sequences associated with the dominant minimum distance error events for a PR4 sequence detector in NRZ, PR4, EPR4 and EEPR4 space, respectfully. In general, a higher order sequence detector will outperform a lower order sequence detector due to the number of data samples the error event affects. Consider, for example, the first error event in the NRZ space shown in FIG. 3A. This error event generates two noise samples which corrupt two data samples (two output bits) in the PR4 space of FIG. 3B, four noise samples in the EPR4 space of FIG. 3C, and four noise samples with two having increased magnitude in the EEPR4 space of FIG. 3D. This "spreading out" of the error event reduces the probability of a detection error.

A minimum distance error event can occur where the data sequences diverge from a particular state in the trellis and then remerge at a later state. In a perfect system, all of the minimum distance error events will occur with equal probability. However, because the channel equalizers correlate the noise in the signal samples, the minimum length, minimum distance error events are more likely to occur. Thus, the error events shown in FIGS. 3A–3D are the "dominant" minimum distance error events because they are shortest in length. The first error event (+ in NRZ), which is the shortest error event, is typically the most dominant; however, depending on the partial response polynomial employed, other error events may become the most dominant as the linear bit density increases.

An increase in performance can be achieved by employing a channel code to code out data sequences associated with the minimum distance error events (similar to coding out the quasi-catastrophic data sequences), and then to match the trellis sequence detector to this channel code. For example, the minimum distance error events shown in FIG. 3A can be coded out by removing the bit sequences consisting of (1,0,1) or (0,1,0) from the input sequence. The state machine of a PR4 sequence detector can then be matched to this code constraint by removing the inner branches shown in FIG. 2A. With these branches removed, the minimum distance of the sequence detector increases from $dmin^2=2$ to $dmin^2=4$ (with the signal samples normalized to +1, 0, −1).

The recording and reproduction of digital data through a disk storage medium can be modeled as a communication channel. Partial response signaling is particularly well suited to disk storage systems because they are bandpass channels in nature and therefore less equalization is required to match the overall response to a desired partial response polynomial. Referring to FIG. 1A, higher order partial response polynomials, such as EEPR4, are more closely matched to the channel's natural response than lower order polynomials, particularly at higher linear densities. Thus, in addition to spreading out the error samples as shown in FIG. 3, higher order partial response channels typically provide better performance since less equalization is required to match the channel's response to the desired partial response. However, the trade-off in performance is the cost of complexity; the number of states in the state machine increases by $2^{n+1}$ which means an exponential increase in complexity. A full EEPR4 state machine comprises sixteen states (n=3), as shown in FIG. 6, as compared to only four states in a PR4 state machine, as shown in FIG. 2A. The complexity of the EEPR4 state machine can be reduced by matching it to a run-length limited (RLL) d=1 constraint (which prevents consecutive NRZI one bits) as illustrated in FIG. 7. The states and branches shown as dashed lines are eliminated due to the RLL d=1 constraint, leaving only ten states.

Another advantage of matching the EEPR4 state machine to a RLL d=1 constraint is that it codes out the minimum distance error events associated with an EEPR4 sequence detector. However, at higher linear densities (user densities of 2.5 to 3 channel symbols per pulse-width at half maximum PW50) the error event (+00+) in NRZ, which is not coded out by the RLL d=1 constraint, becomes the most dominant error event. Therefore, coding out the minimum distance error events provides less benefit at higher linear densities. The applicant's have determined that a modified EEPR4 channel (MEEPR4) with a polynomial of $$(1+D)(1-D^3)$$

exhibits a frequency response wherein the error event (+00+) in NRZ is attenuated at higher linear densities. In addition, MEEPR4 increases the signal-to-noise ratio (SNR) because it requires less equalization to match the response of the recording channel to the MEEPR4 target.

The MEEPR4 d=1 channel has been studied previously in a paper by K. Shimoda et al. entitled "New Type (1,7) RLL Partial Response over 5 Gbit/in$^2$ Areal Density," *IEEE Transactions on Magnetics,* Vol. 33, No. 5, September 1997. However, as described in that paper, the MEEPR4 d=1 channel cannot be implemented directly because a certain data sequence generates quasi-catastrophic errors, namely the data sequence ( . . . 1,1,0,0,0,0,1,1,0,0,0,0,1,1. . . ) and the inverse sequence collectively referred to as the (2,4,2) quasi-catastrophic data sequence.

There is, therefore, a need for a sampled amplitude read channel which codes out the (2,4,2) quasi-catastrophic data sequence, thereby enabling the application of an MEEPR4 d=1 sequence detector for detecting binary data recorded on a disk storage medium. A further object of the present invention is to code out certain minimum distance error events to further enhance the performance of the MEEPR4 d=1 sequence detector. Yet another object of the present invention is to implement an additional constraint, an RLL k constraint, which enables operation of the gain control and timing recovery circuits of the sampled amplitude read channel. Still another object of the present invention is to provide a channel code with a high code rate for implementing the above constraints.

SUMMARY OF THE INVENTION

A sampled amplitude read channel is disclosed for disk storage systems comprising an MEEPR4 equalizer, an MEEPR4 sequence detector matched to an RLL d=1 constraint, and an encoder/decoder for implementing a channel code that codes out (2,4,2) quasi-catastrophic data sequences. A rate n/m finite state encoder encodes n bits of user data into m bits of write data, and a sliding block decoder decodes m bits of read data into n bits of estimated user data. The encoder uses the current n bits of user data as well as a current state of a state machine to generate the m bits of write data, where a state-splitting technique is employed to achieve a high code rate in a practical, cost effective implementation. The decoder decodes the m bits of read data into the n bits of estimated user data by evaluating the current detected codeword in context with the following detected codeword. In this manner, the decoder processes at most two detected codewords at a time; an error in any one detected codeword will propagate to at most three decoded symbols of estimated user data, or equivalently, it will affect at most one symbol per codeword in a three-way interleaved ECC system. Matching the sequence detector's state transition diagram to an RLL d=1 constraint enhances performance by coding out certain minimum distance error events; furthermore, it reduces the cost and complexity by eliminating the states and branches that correspond to the d=1 constraint.

BRIEF DESCRIPTION OF THE DRAWINGS

The above and other aspects and advantages of the present invention will be better understood by reading the following detailed description of the invention in conjunction with the drawings, wherein.

DETAILED DESCRIPTION OF THE PREFERRED EMBODIMENT

Data Format

Figure 4A:
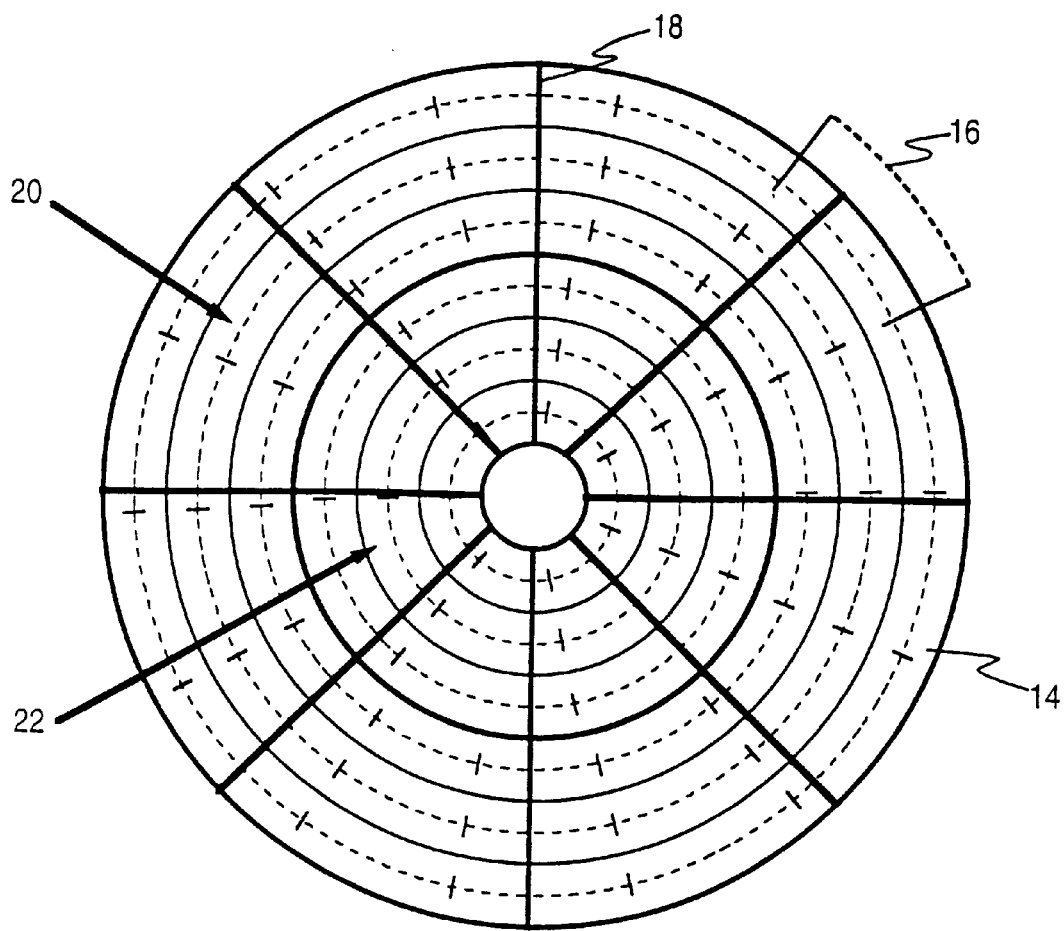
FIG. 4A shows a typical data format for a magnetic disk storage medium, comprising a plurality of concentric data tracks grouped in predefined zones, where each data track is partitioned into a number of data sectors.

FIG. 4A shows a conventional data format of a magnetic disk storage medium comprising a series of concentric, radially spaced data tracks 14, wherein each data track 14 comprises a plurality of sectors 16 with embedded servo wedges 18. A servo controller (not shown) processes the servo data in the servo wedges 18 and, in response thereto, positions a read/write head over a selected track. Additionally, the servo controller processes servo bursts within the servo wedges 18 to keep the head aligned over a centerline of the selected track while writing and reading data. The servo wedges 18 may be detected by a simple discrete-time pulse detector or by the discrete-time sequence detector of FIG. 5. The format of the servo wedges 18 includes a preamble and a sync mark, similar to the user data sectors 16 described below with reference to FIG. 4B.

Zoned recording is a technique known in the art for increasing the storage density by recording the user data at different rates in predefined zones between the inner diameter and outer diameter tracks. The data rate can be increased at the outer diameter tracks due to the increase in circumferential recording area and the decrease in intersymbol interference. This allows more data to be stored in the outer diameter tracks as is illustrated in FIG. 4A where the disk is partitioned into an outer zone 20 comprising fourteen data sectors per track, and an inner zone 22 comprising seven data sectors per track. In practice, the disk is actually partitioned into several zones with increasing data rates from the inner to outer diameter zones.

Figure 4B:
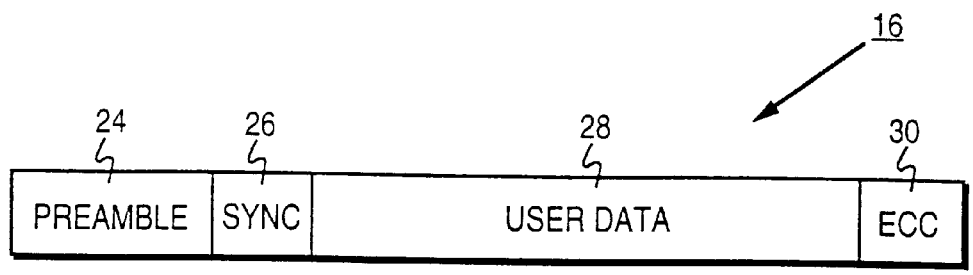
FIG. 4B shows a typical format for a data sector in a track of FIG. 4A.

FIG. 4B shows the format of a data sector 16 comprised of an acquisition preamble 24, a sync mark 26, a user data field 28, and appended ECC bytes 30 for use in detecting and correcting errors in the user data upon readback. Timing recovery 68 of FIG. 5 processes the acquisition preamble 24 to acquire the correct data frequency and phase before reading the user data field 28, and the sync mark 26 demarks the beginning of the user data field 28 for use in symbol synchronizing the user data.

Sampled Amplitude Read Channel

Figure 3A:
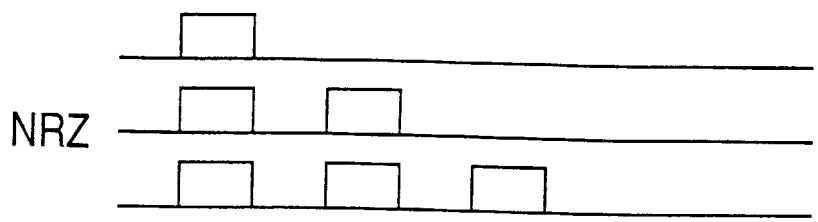
FIGS. 3A–3D show the dominant error events that can occur in a PR4 sampled amplitude read channel in NRZ, PR4, EPR4 and EEPR4 space, respectively.
Figure 3B:
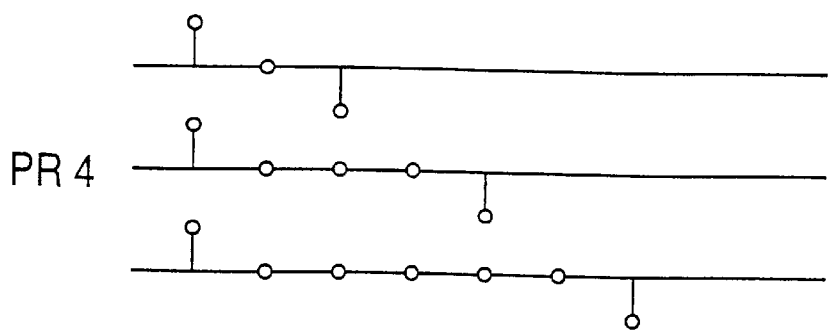
Figure 3C:
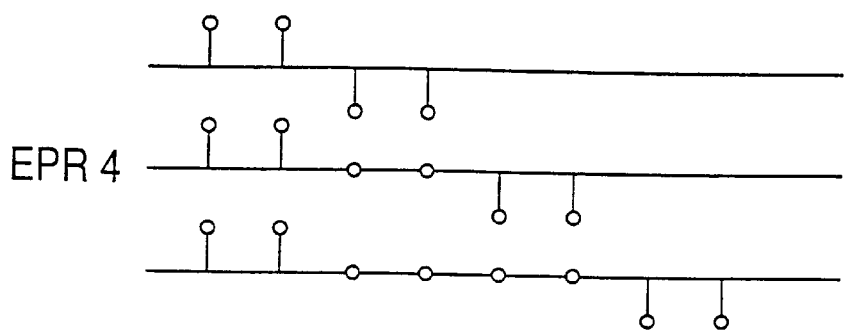
Figure 3D:
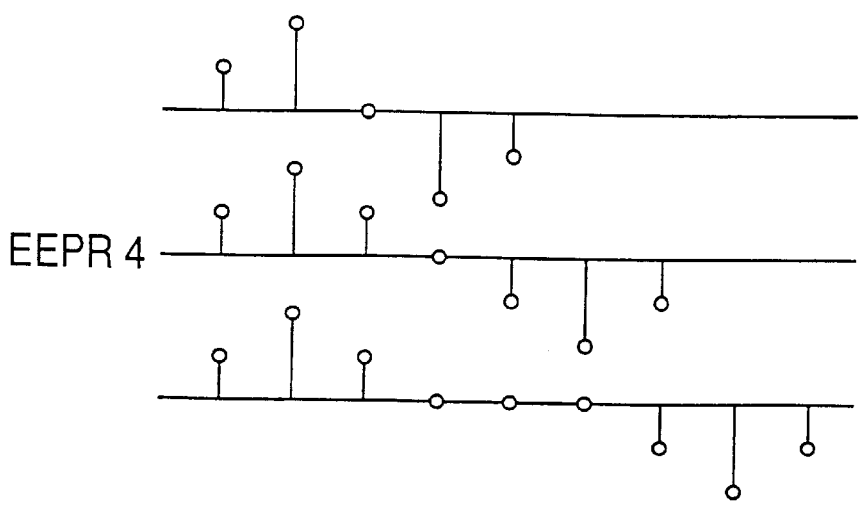
Figure 5:
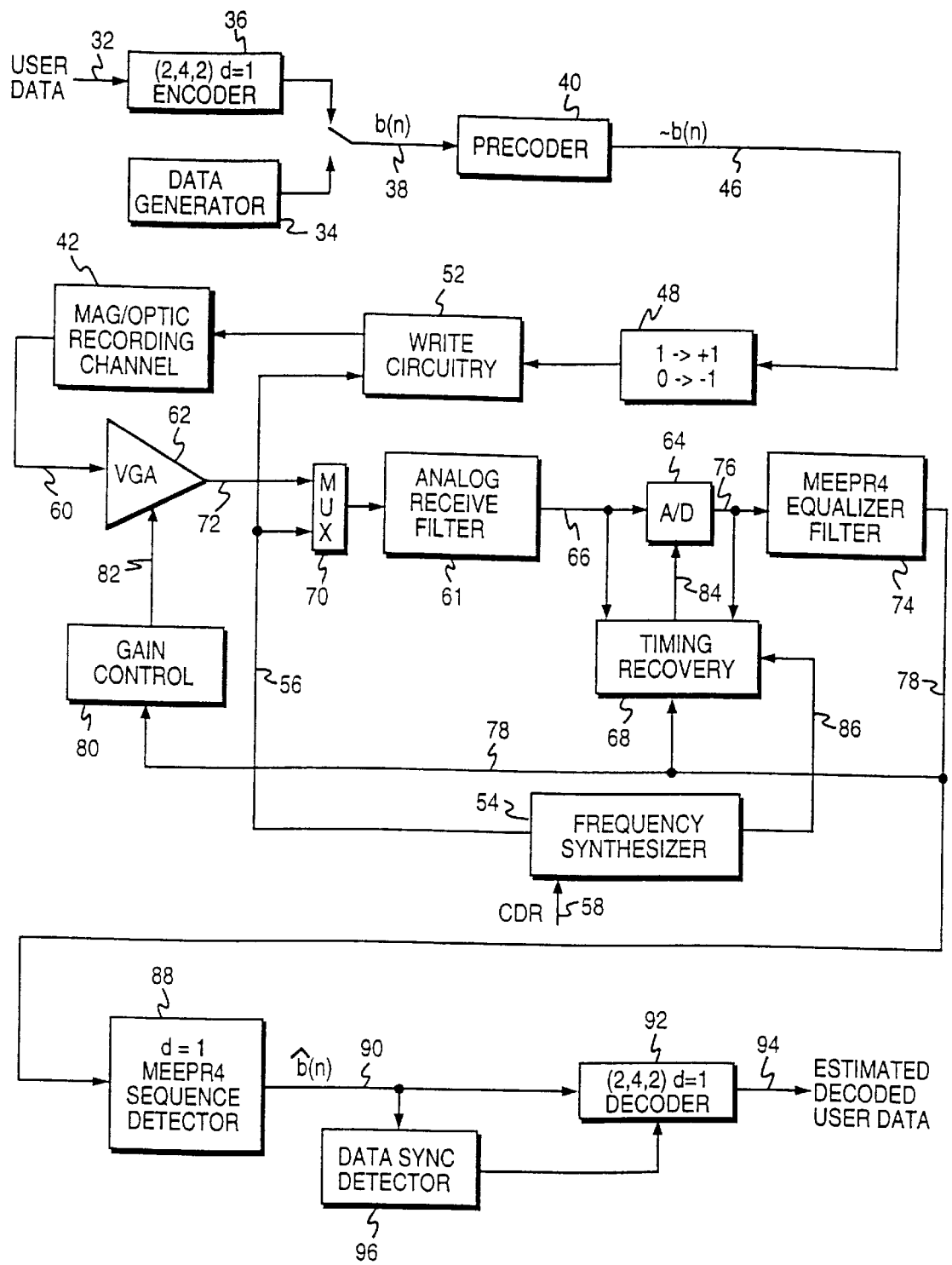
FIG. 5 is a block diagram of the sampled amplitude read channel of the present invention, including an MEEPR4 equalizer, a d=1 MEEPR4 sequence detector, and a (2,4,2) encoder/decoder.
Figure 6:
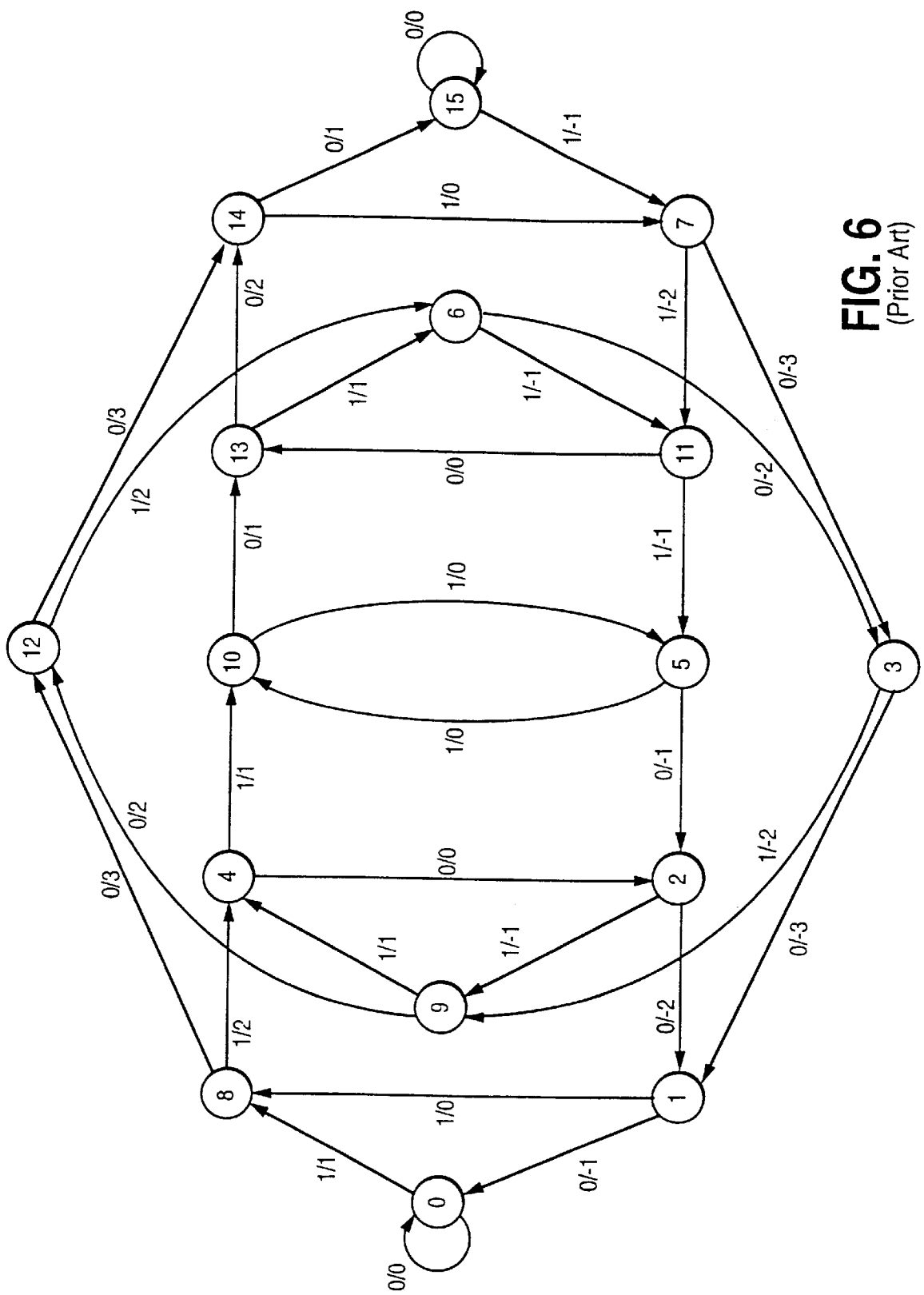
FIG. 6 is a state transition diagram for a full sixteen state EEPR4 sequence detector.

Referring now to FIG. 5, shown is a block diagram of the sampled amplitude read channel of the present invention. During a write operation, the read channel receives user data over line 32 from the host system. A data generator 34 generates the preamble 24 of FIG. 4B (for example 2T preamble data) written to the disk prior to writing the user data 28. The data generator 34 also generates a sync mark 26 for use in symbol synchronizing to the user data during a read operation. A (2,4,2) d=1 encoder 36 encodes the user data 32 according to a (2,4,2) constraint which codes out the (2,4,2) quasi-catastrophic data sequences. The encoder 36 also encodes the user data 32 according to a run-length limited (RLL) d=1 constraint in order to code out the minimum distance error events shown in FIG. 3A, and an RLL k constraint in order to enable operation of timing recovery and gain control.

After RLL encoding 36, a precoder 40 precodes the binary sequence b(n) 38 in order to compensate for the transfer function of the recording channel 42 and equalizing filters. The precoded sequence of NRZ bits ~b(n) 46 modulate the write current of the write circuitry 52, thereby modulating the current in the recording head coil (or intensity of a laser beam) at the zone baud rate to record a sequence of transitions onto the disk 42, where the transitions represent the recorded data. In NRZ recording, a "1" bit modulates a positive write current and a "0" bit modulates a negative write current. A frequency synthesizer 54 provides a baud rate write clock 56 to the write circuitry 52 which is adjusted by a baud or channel data rate signal (CDR) 58 according to the current zone the recording head is over.

Figure 1A:
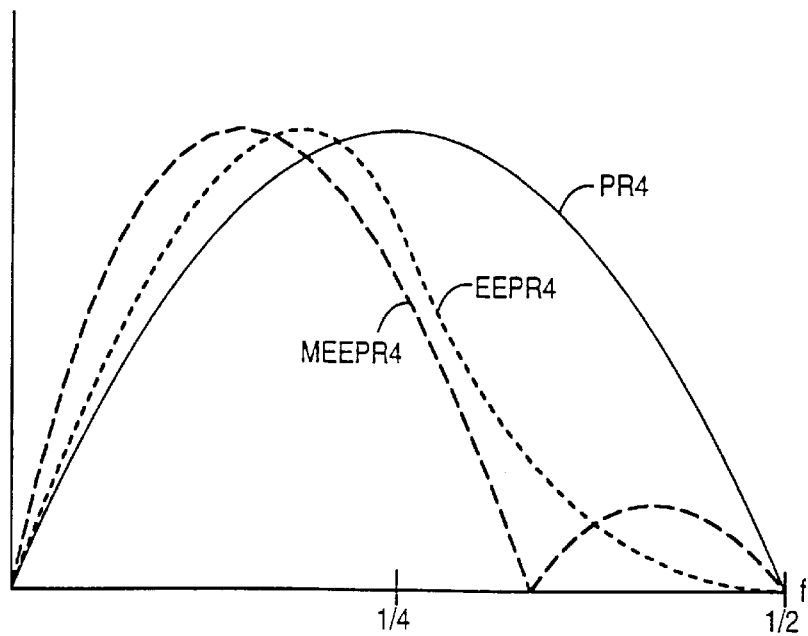
FIG. 1A shows the frequency response for a PR4, EEPR4 and MEEPR4 read channel.

When reading the recorded binary sequence from the media, timing recovery 68 first locks to the write frequency of the zone by selecting, as the input to the read channel, the write clock 56 through a multiplexer 70. Once locked to the write frequency, which is the nominal sampling frequency, the multiplexer 70 selects the signal 72 from the read head as the input to the read channel in order to acquire the acquisition preamble 24 recorded on the disk prior to the recorded user data 28 as shown in FIG. 4B. A variable gain amplifier 62 adjusts the amplitude of the analog read signal 60, and an analog receive filter 61 provides initial equalization toward the desired MEEPR4 response as well as attenuating aliasing noise. A sampling device 64 samples the analog read signal 66 from the analog filter 61, and a discrete-time MEEPR4 equalizer filter 74 provides further equalization of the sample values 76 toward the desired MEEPR4 response shown in FIG. 1A. The discrete MEEPR4 equalizer filter 74 may be implemented as a real-time adaptive filter which compensates for parameter variations over the disk radius (i.e., zones), disk angle, and environmental conditions such as temperature drift.

After equalization, the equalized sample values 78 are applied to a decision directed gain control 80 and timing recovery 68 circuit for adjusting the amplitude of the read signal 60 and the frequency and phase of the sampling device 64, respectively. Gain control 80 adjusts the gain of variable gain amplifier 62 over line 82 in order to match the magnitude of the channel's frequency response to the desired MEEPR4 partial response, and timing recovery 68 adjusts the frequency of sampling device 64 over line 84 in order to synchronize the equalized samples 78 to the baud rate. Frequency synthesizer 54 provides a course center frequency setting to the timing recovery circuit 68 over line 86 in order to center the timing recovery frequency over temperature, voltage, and process variations.

Example embodiments for timing recovery 68 and gain control 80 are disclosed in the above references U.S. Pat. Nos. 5,359,631 and 5,297,184, respectively. These embodiments assume that timing recovery and gain control operate on channel samples equalized into a MEEPR4 response. However, an alternative embodiment is to equalize to a PR4 response so that a simple slicer can generate estimated samples for timing recovery and gain control, and then equalize to a MEEPR4 response for sequence detection. The choice of equalization for timing recovery and gain control is a design criteria based on the desired performance at a given data density; it is not a limitation of the present invention.

For details on the preferred embodiment for an adaptive discrete-time equalizer, see the above referenced U.S. Pat. No. 5,966,415, "ADAPTIVE EQUALIZATION IN A SUB-SAMPLED READ CHANNEL FOR DISK STORAGE SYSTEMS." The aforementioned U.S. patent also illustrates an alternative embodiment for synchronous-sampling timing recovery 68: sampling the analog read signal asynchronously and interpolating to generate the baud rate synchronous samples. Furthermore, the aforementioned U.S. patent application discloses a technique for sub-sampling the analog read signal in order to increase throughput without increasing the speed of the read channel circuitry. These alternative embodiments are congruent with the present invention and may or may not be implemented depending on the design criteria for a particular storage system.

Figure 1B:
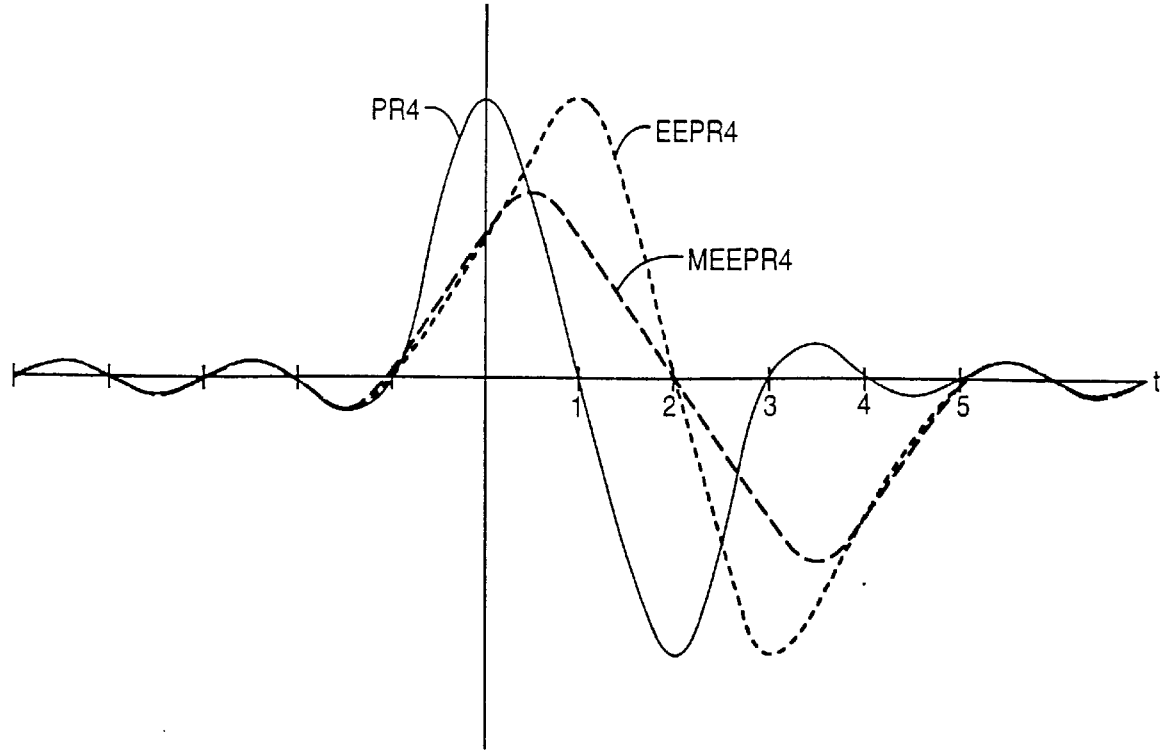
FIG. 1B shows the dipulse responses for the PR4, EEPR4 and MEEPR4 read channels of FIG. 1A.
Figure 2A:
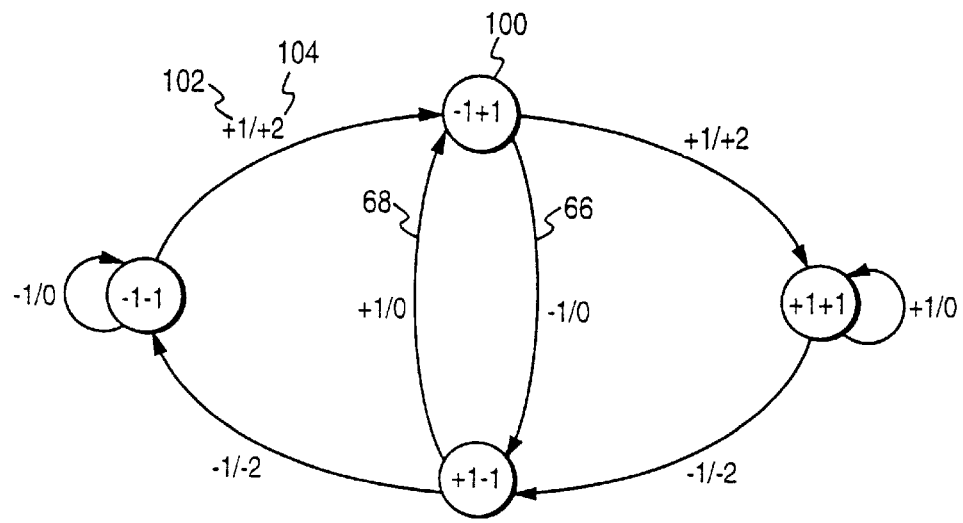
FIG. 2A is a state transition diagram for a PR4 sequence detector.
Figure 2B:
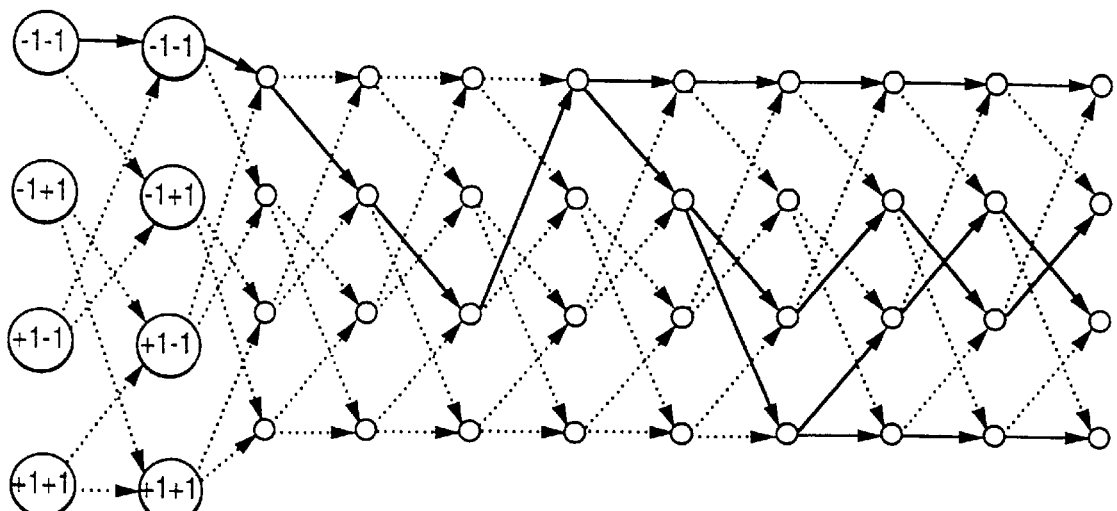
FIG. 2B is a trellis diagram corresponding to the PR4 state transition diagram of FIG. 2A showing the path memory and survivor sequence for a given input sequence.
Figure 7:
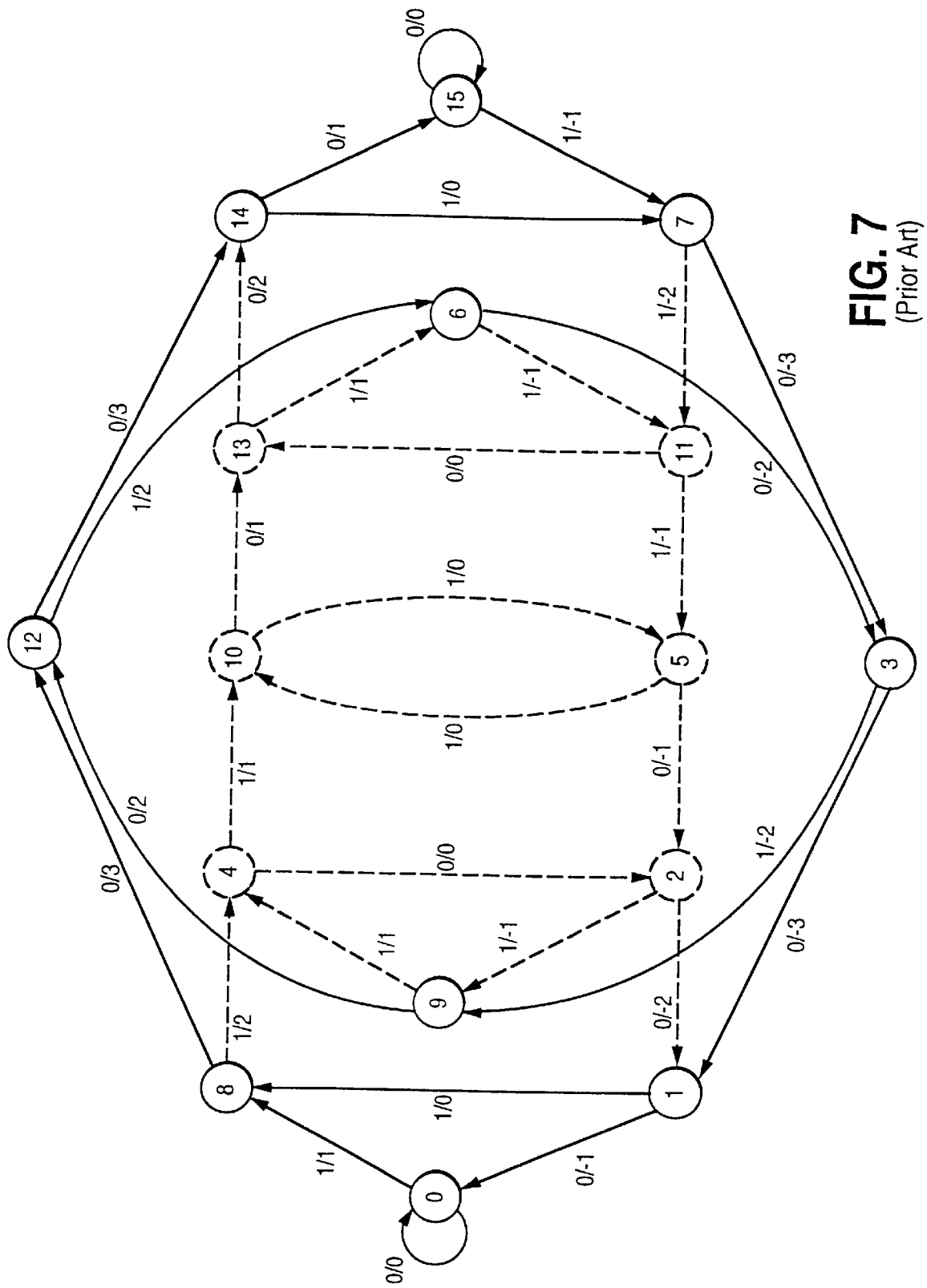
FIG. 7 is a state transition diagram for a reduced complexity (ten state) EEPR4 sequence detector matched to a RLL d=1 constraint.
Figure 8:
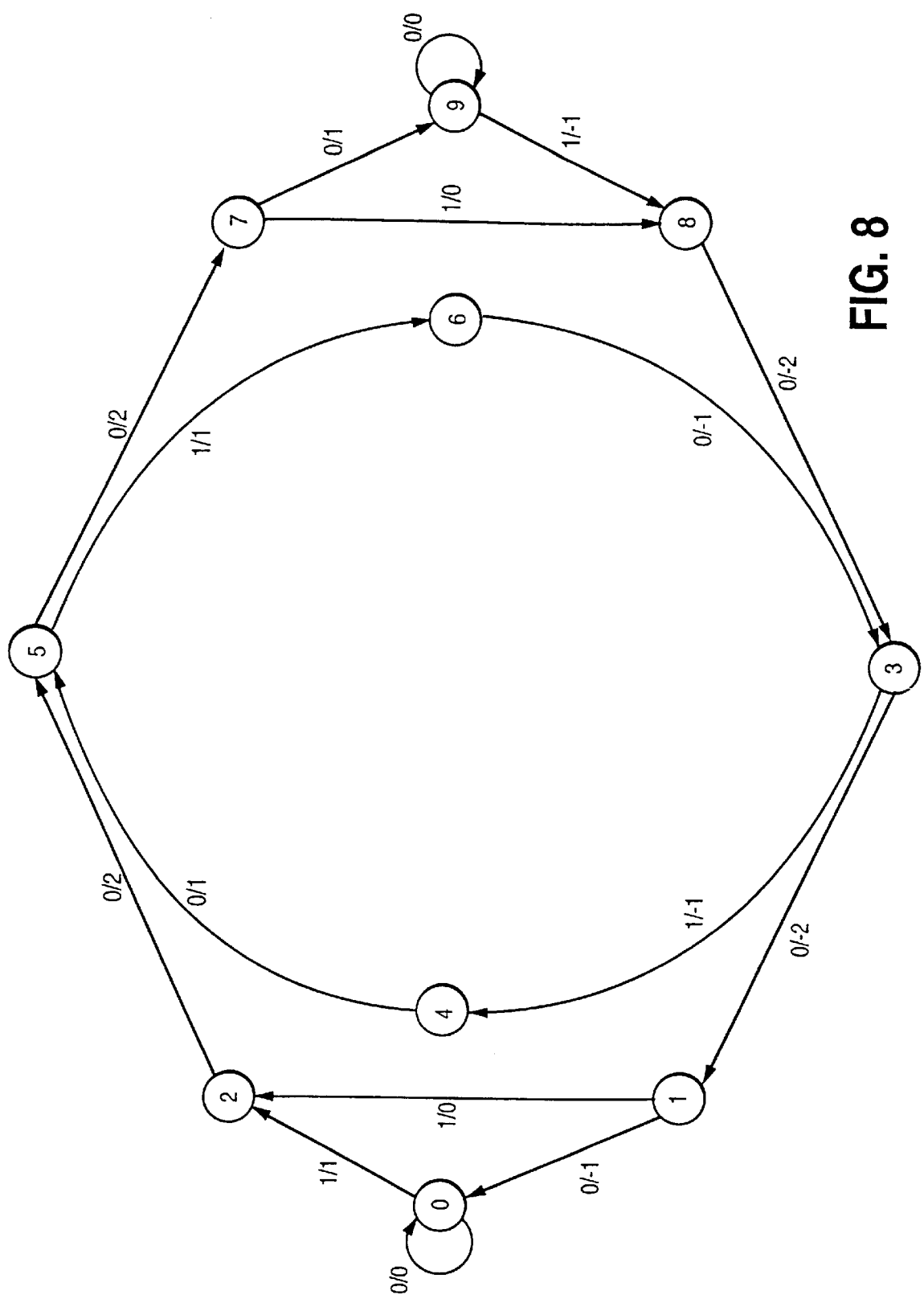
FIG. 8 is a state transition diagram for a ten state MEEPR4 sequence detector matched to a RLL d=1 constraint.

The synchronous, equalized samples 78 are ultimately input into a d=1 MEEPR4 sequence detector 88 which detects an estimated binary sequence ^b(n) 90 from the synchronous channel samples 78. As described above, an MEEPR4 read channel is characterized by the polynomial $$(1+D)(1-D^3)$$

which has a normalized dipulse response (1, 1, 0, -1, -1) as shown in FIG. 1B. When matched to an RLL d=1 constraint, the corresponding state transition diagram for the MEEPR4 sequence detector 88 is shown in FIG. 8 which is similar to the d=1 EEPR4 state transition diagram shown in FIG. 7, but with the states and branches shown as dashed lines deleted. Similar to the d=1 EEPR4 sequence detector, the d=1 MEEPR4 sequence detector 88 of the present invention provides a distance enhancing performance gain by eliminating the minimum distance error events. In addition, the MEEPR4 channel outperforms the conventional EEPR4 channel because the MEEPR4 response attenuates the (+00+) NRZ error event at higher linear densities and it requires less equalization to match the channel's response to the MEEPR4 target.

A (2,4,2) d=1 decoder 92 decodes the estimated binary sequence ^b(n) 90 output by the sequence detector 88 into estimated user data 94. A data sync detector 96 detects the sync mark 26 (shown in FIG. 4B) in the data sector 16 in order to frame operation of the (2,4,2) d=1 decoder 92. In the absence of errors, the estimated binary sequence ^b(n) 90 matches the recorded binary sequence b(n) 38, and the decoded user data 94 matches the recorded user data 32. Implementation details concerning the (2,4,2) d=1 encoder/decoder are provided below.

(2,4,2) d=1 Encode/Decoder

Figure 9A:
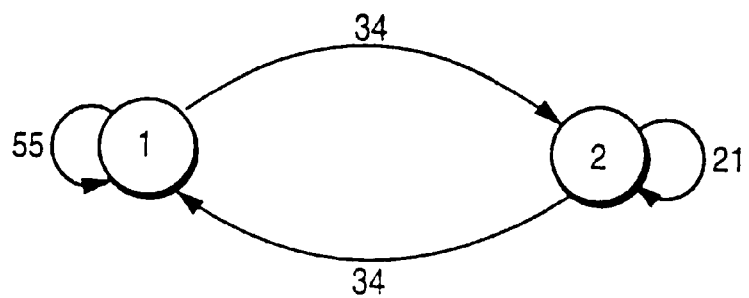
FIG. 9A is a state transition diagram comprising two states for implementing the (2,4,2) and RLL d=1 code constraints for a codeword comprising 9 bits.
Figure 9B:
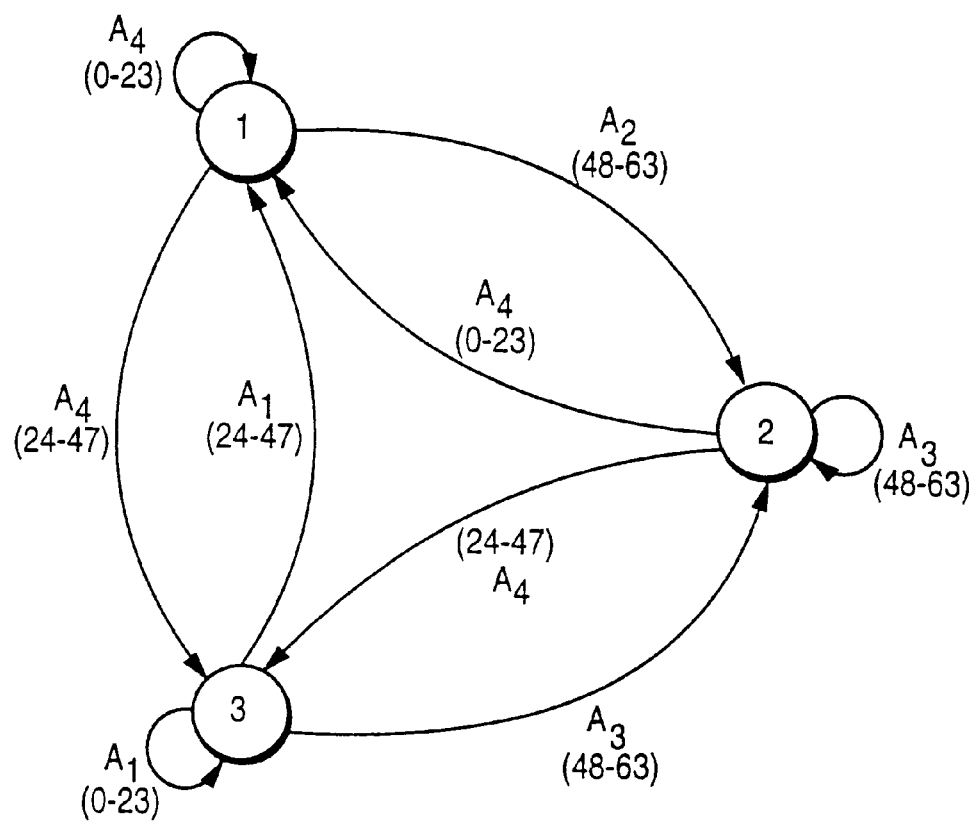
FIG. 9B illustrates how state splitting increases the number of codewords in the state transition diagram of FIG. 9A to implement a rate 6/9 code with an RLL k=16 constraint.

The channel code of the present invention is implemented by constructing a finite state transition diagram (FSTD)

which defines all possible encoded sequences or codewords which satisfy the RLL d=1 constraint, and then by selecting a subset of codewords from the available codeword set which meets the (2,4,2) constraint and which minimizes the RLL k constraint. An example of a two state FSTD for a 9-bit codeword is shown in FIG. 9A. An encoder implemented pursuant to this FSTD encodes n-bit user data sequences into 9-bit codeword sequences which are concatenated in a manner that satisfies the RLL d=1 constraint. The particular 9-bit output codeword depends on the state (1 or 2) of the encoder. When in state 1 of FIG. 9A, the encoder outputs 55 9-bit codewords that lead back to state 1 and 34 9-bit codewords that lead to state 2, for a total of 99 9-bit output codewords which is sufficient to encode 64 6-bit input codewords. However, when in state 2, the encoder outputs 21 9-bit codewords that lead back to state 2 and 34 9-bit codewords that lead back to state 1, for a total of only 55 9-bit output codewords which is not enough to encode all 64 input codewords for a rate 6/9 code. To overcome this deficiency, state 1 of FIG. 9A is split into two states, states 1 and 3 as shown in FIG. 9B. In this manner, each state in the FSTD is able to generate enough codewords to encode all 64 6-bit input codewords for rate a 6/9 code. A subset of the availaible output codewords is then selected which satisfies the (2,4,2) code constraint as well as minimizes the RLL k constraint.

Figure 10A:
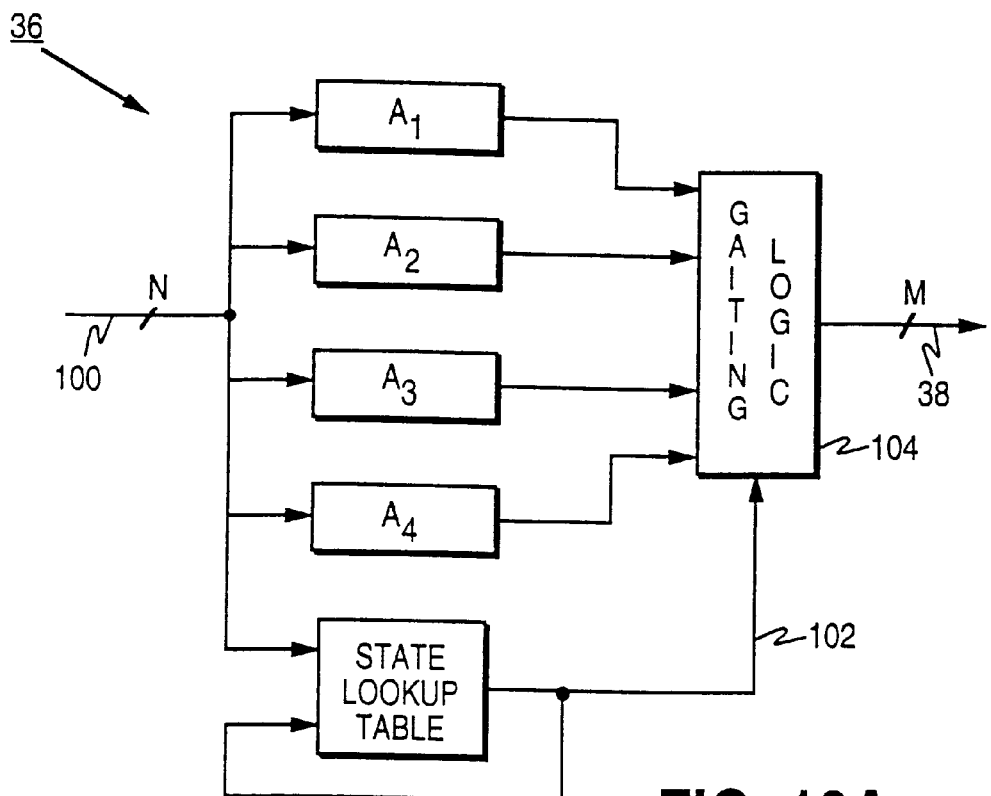
FIG. 10A shows details of the (2,4,2) finite state encoder employed in the sampled amplitude read channel of the present invention.

The state branches in the FSTD of FIG. 9B are labeled with the 6-bit input codeword and the table for generating a corresponding 9-bit output codeword. For example, if the encoder is in state 1, then table $A_4$ is used to encode the input codewords 0–23 and the encoder remains in state 1, table $A_2$ is used to encode the input codewords 48–63 and the encoder changes to state 2, and table $A_4$ is used to encode the input codewords 24–47 and the encoder changes to state 3. Implementation details for the (2,4,2) d=1 encoder 36 of FIG. 5 are shown in FIG. 10A.

The encoder comprises four lookup tables $A_1$–$A_4$ which encode an N-bit input codeword received over line 100. A state lookup table generates a state signal 102 based on the N-bit input codeword and the current state, where the initial state of the encoder is set arbitrarily (e.g., to state 1 of FIG. 9B). Gaiting logic 104 selects the appropriate table output $A_1$–$A_4$ in response to the state signal 102 as the M-bit output codeword 38 of the encoder.

To further understand the encoding operation, consider that if the encoder is initially in state 1 of FIG. 9B, then for N-bit input codewords of 48–63 the gaiting logic 104 selects the output of table $A_2$ as the M-bit output of the encoder 38, and the state lookup table changes the state signal 102 to state 2. If the next N-bit input codeword is 24–47, then the gaiting logic 104 selects the output of table $A_4$ as the M-bit output 38 of the encoder, and the state lookup table changes the state signal 102 to state 3, and so on.

For the rate 6/9 FSTD of FIG. 9B, the following table illustrates the operation of the encoder 36:

| State Signal | Input Codeword | Output Table | Next State |
|---|---|---|---|
| 1 | 0–23 | $A_4$ | 1 |
| 1 | 24–47 | $A_4$ | 3 |
| 1 | 48–63 | $A_2$ | 2 |
| 2 | 0–23 | $A_4$ | 1 |
| 2 | 24–47 | $A_4$ | 3 |
| 2 | 48–63 | $A_3$ | 2 |
| 3 | 0–23 | $A_1$ | 3 |
| 3 | 24–47 | $A_1$ | 1 |
| 3 | 48–63 | $A_3$ | 2 | where the encoder tables $A_{1-A4}$ are shown in the following table:

| $A_1$ | | $A_2$ | | $A_3$ | | $A_4$ | |
|---|---|---|---|---|---|---|---|
| INPUT | OUTPUT | INPUT | OUTPUT | INPUT | OUTPUT | INPUT | OUTPUT |
| 00/24 | 002 | 48 | 001 | 48 | 021 | 00/24 | 012 |
| 01/25 | 004 | 49 | 005 | 49 | 025 | 01/25 | 020 |
| 02/26 | 010 | 50 | 011 | 50 | 041 | 02/26 | 022 |
| 03/27 | 400 | 51 | 111 | 51 | 045 | 03/27 | 024 |
| 04/28 | 402 | 52 | 401 | 52 | 051 | 04/28 | 040 |
| 05/29 | 404 | 53 | 405 | 53 | 101 | 05/29 | 042 |
| 06/30 | 410 | 54 | 411 | 54 | 105 | 06/30 | 044 |
| 07/31 | 412 | 55 | 421 | 55 | 125 | 07/31 | 052 |
| 08/32 | 420 | 56 | 425 | 56 | 201 | 08/32 | 102 |
| 09/33 | 422 | 57 | 441 | 57 | 205 | 09/33 | 104 |
| 10/34 | 449 | 58 | 445 | 58 | 211 | 10/34 | 110 |
| 11/35 | 442 | 59 | 451 | 59 | 221 | 11/35 | 112 |
| 12/36 | 444 | 60 | 501 | 60 | 225 | 12/36 | 120 |
| 13/37 | 450 | 61 | 511 | 61 | 241 | 13/37 | 122 |
| 14/38 | 452 | 62 | 521 | 62 | 245 | 14/38 | 124 |
| 15/39 | 500 | 63 | 525 | 63 | 251 | 15/39 | 202 |
| 16/40 | 502 | | | | | 16/40 | 204 |
| 17/41 | 504 | | | | | 17/41 | 210 |
| 18/42 | 510 | | | | | 18/42 | 220 |
| 19/43 | 512 | | | | | 19/43 | 224 |
| 20/44 | 520 | | | | | 20/44 | 240 |
| 21/45 | 522 | | | | | 21/45 | 244 |
| 22/46 | 524 | | | | | 22/46 | 250 |
| 23/47 | 000 | | | | | 23/47 | 252 |

The codewords in the above table (shown in octal) were selected from the avaible codeword set in order to meet the (2,4,2) constraint and to provide a minimum RLL k constraint of k=16.

Figure 10B:
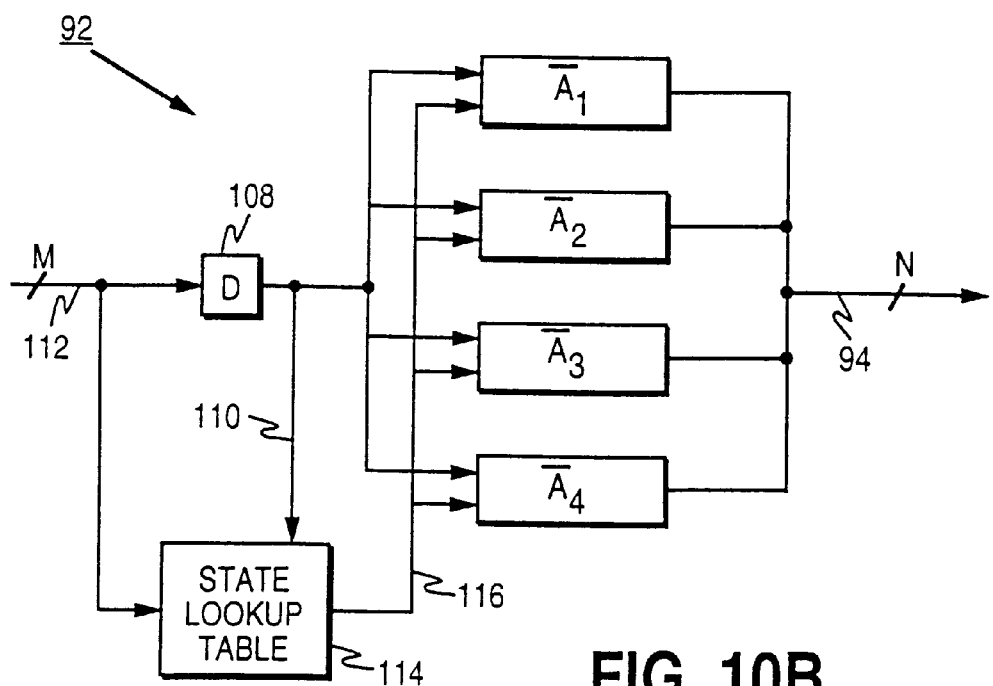
FIG. 10B shows details of the (2,4,2) sliding block decoder employed in the sampled amplitude read channel of the present invention.

To decode a codeword during a read operation, the decoder 92 of FIG. 5 evaluates the current M-bit codeword output by the Viterbi detector 88 and the next M-bit codeword. This is illustrated in FIG. 10B which shows further implementation details for the decoder 92. A register 108 stores the current codeword 110 with the next codeword input over line 112. Both the current codeword 110 and the next codeword 112 are input into a state lookup table 114 which generates a control signal over line 116 to select the table used to decode the current codeword 110. Further, the control signal 116 comprises an additional address bit representing the next codeword for use in the decoding process as is understood from the decoding table set forth below. The decoder 92 comprises four tables $\overline{A}_1$–$\overline{A}_4$ which implement the inverse mapping of the encoder tables $A_1$–$A_4$ of FIG. 10A. The decoder tables $\overline{A}_1$–$\overline{A}_4$ comprise tristate output buffers that are wire-ORed together to form the N-bit output 94; the tristate buffer for the appropriate table $\overline{A}_1$–$\overline{A}_4$ is enabled by the control signal 116 generated by the state lookup table 114.

For the rate 6/9 FSTD of FIG. 9B, the operation of the decoder 92 is understood from the following table:

| Next Codeword | Current Codeword | Decoded Codeword |
| --- | --- | --- |
| $A_1, A_3$ | $A_1$ | 0–23 |
| $A_4, A_2$ | $A_1$ | 24–47 |
| $A_4, A_2$ | $A_4$ | 0–23 |
| $A_1, A_3$ | $A_4$ | 24–47 |
| XX | $A_2$ | 48–63 |
| XX | $A_3$ | 48–63 |

In the above table, the next codeword is used to decode the current codeword only if the current codeword was encoded using table $A_1$ or $A_4$. Accordingly, the control signal 116 generated by the state lookup table 114 comprises an additional address bit representing the next codeword; this address bit is used to decode the current codeword in the first two rows of the above table. If the current codeword was encoded using tables $A_2$ or $A_3$, then the decoding is unique and independent of the next codeword (i.e., the additional address bit in the control signal 116 is ignored).

During the decoding operation, an error spanning two detected codewords will affect at most one extra codeword since the decoder operates on at most two codewords at a time. Thus, burst errors spanning two codewords will propagate to a third codeword in the decoding process; however, three contiguous codewords in error are generally correctable using a three-way interleaved error correction code (ECC).

The rate 6/9 FSTD of FIG. 9B is relatively cost effective to implement due to the small tables employed in the encoder/decoder. However, minimizing the RLL k constraint results in better performance by the decision-directed timing recovery and gain control loops. The RLL k constraint can be made shorter by increasing the size of the codewords and, consequently, increasing the size of the tables in the encoder/decoder. For example, it is possible to achieve an RLL k=10 constraint by using a rate 8/12 channel code.

Figure 9C:
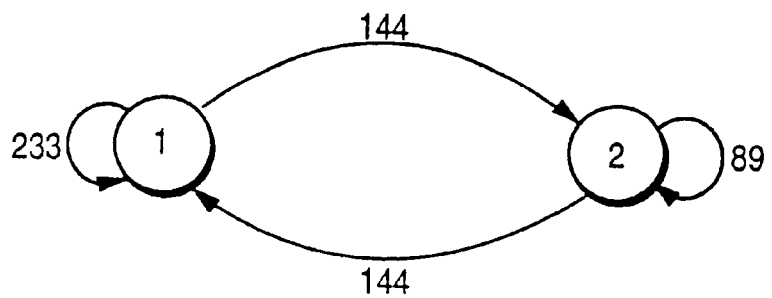
FIG. 9C is a state transition diagram comprising two states for implementing the (2,4,2) and RLL d=1 code constraints for a codeword comprising 12 bits.
Figure 9D:
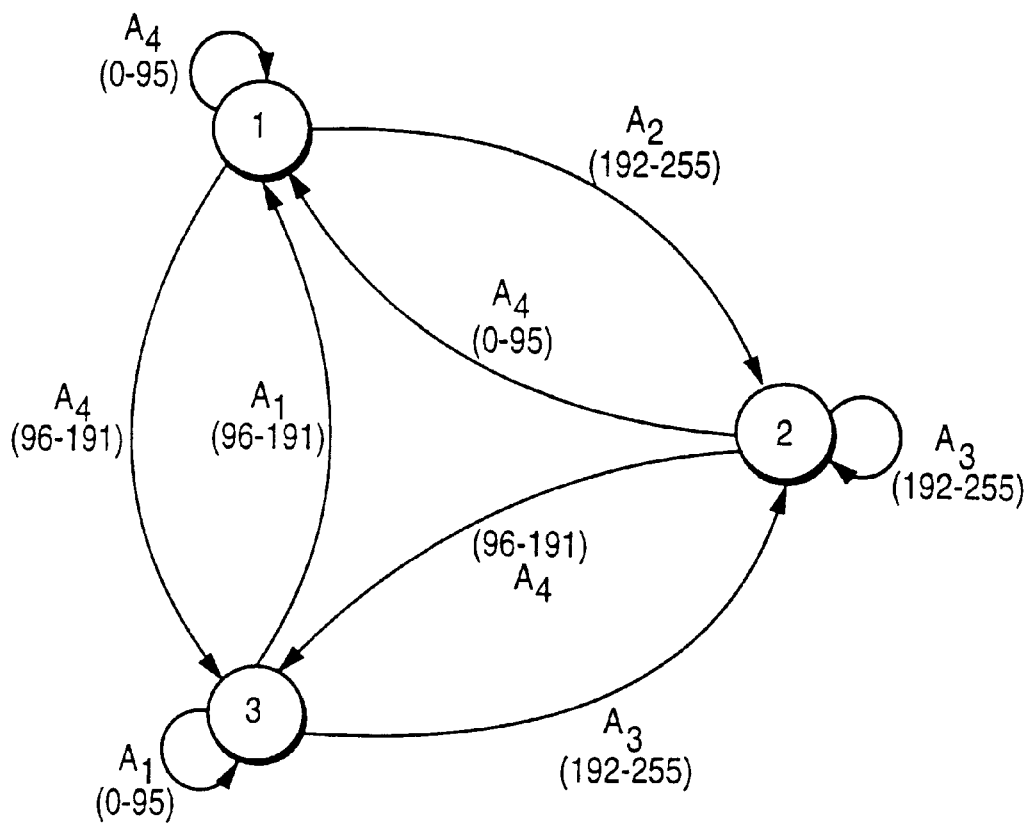
FIG. 9D illustrates how state splitting increases the number of codewords in the state transition diagram of FIG. 9C to implement a rate 8/12 code with an RLL k=10 constraint.

A two state FSTD for 12-bit output codewords that satisfty the RLL d=1 constraints is shown in FIG. 9C. Similar to the two state FSTD of FIG. 9A, the two state FSTD of FIG. 9C cannot generate enough output codewords from state 2 to implement a rate 8/12 code. Therefore, the same state splitting technique is employed to split state 1 into states 1 and 3 as shown in FIG. 9D. Similar to FIG. 9B, the state branches of FIG. 9D are labeled with the 8-bit input codeword and the corresponding table used to generate the 12-bit output codeword. The encoder tables $A_1$–$A_4$ used in the encoder of FIG. 10A, which are selected from the available codeword set defined by the FSTD of FIG. 9D and which meet the (2,4,2) constraint and provide an RLL k=10 constraint, are shown in the following table:

| $A_1$ | | $A_2$ | | $A_3$ | | $A_4$ | |
| --- | --- | --- | --- | --- | --- | --- | --- |
| INPUT | OUTPUT | INPUT | OUTPUT | INPUT | OUTPUT | INPUT | OUTPUT |
| 0/96 | 010100010010 | 192 | 010100010101 | 192 | 000010000101 | 0/96 | 000010000100 |
| 1/97 | 010100100000 | 193 | 010100100001 | 193 | 000010001001 | 1/97 | 000010001000 |
| 2/98 | 010100100010 | 194 | 010100100101 | 194 | 000010010001 | 2/98 | 000010001010 |
| 3/99 | 010100100100 | 195 | 010100101001 | 195 | 000010010101 | 3/99 | 000010010000 |
| 4/100 | 010100101000 | 196 | 010101000001 | 196 | 000010100001 | 4/100 | 000010010010 |
| 5/101 | 010100101010 | 197 | 010101000101 | 197 | 000010100101 | 5/101 | 000010010100 |
| 6/102 | 010101000000 | 198 | 010101001001 | 198 | 000010101001 | 6/102 | 000010100000 |
| 7/103 | 010101000010 | 199 | 010101010001 | 199 | 000100000001 | 7/103 | 000010100010 |
| 8/104 | 010101000100 | 200 | 010101010101 | 200 | 000100000101 | 8/104 | 000010100100 |
| 9/105 | 010101001000 | 201 | 100000000001 | 201 | 000100001001 | 9/105 | 000010101000 |
| 10/106 | 010101001010 | 202 | 100000000101 | 202 | 000100010001 | 10/106 | 000010101010 |
| 11/107 | 010101010000 | 203 | 100000001001 | 203 | 000100010101 | 11/107 | 000100000010 |
| 12/108 | 010101010010 | 204 | 100000010001 | 204 | 000100100001 | 12/108 | 000100000100 |
| 13/109 | 010101010100 | 205 | 100000010101 | 205 | 000100100101 | 13/109 | 000100001000 |
| 14/110 | 100000000010 | 206 | 100000100001 | 206 | 000100101001 | 14/110 | 000100001010 |
| 15/111 | 100000000100 | 207 | 100000100101 | 207 | 000101000001 | 15/111 | 000100010000 |
| 16/112 | 100000001000 | 208 | 100000101001 | 208 | 000101001001 | 16/112 | 000100010010 |
| 17/113 | 100000001010 | 209 | 100001000001 | 209 | 000101010001 | 17/113 | 000100010100 |
| 18/114 | 100000010000 | 210 | 100001000101 | 210 | 000101010101 | 18/114 | 000100100000 |
| 19/115 | 100000010010 | 211 | 100001001001 | 211 | 001000000001 | 19/115 | 000100100010 |
| 20/116 | 100000010100 | 212 | 100001010001 | 212 | 001000000101 | 20/116 | 000100100100 |
| 21/117 | 100000100000 | 213 | 100001010101 | 213 | 001000001001 | 21/117 | 000100101000 |
| 22/118 | 100000100010 | 214 | 100010000001 | 214 | 001000010001 | 22/118 | 000100101010 |
| 23/119 | 100000100100 | 215 | 100010000101 | 215 | 001000010101 | 23/119 | 000101000010 |

-continued

| A₁ | | A₂ | | A₃ | | A₄ | |
|---|---|---|---|---|---|---|---|
| INPUT | OUTPUT | INPUT | OUTPUT | INPUT | OUTPUT | INPUT | OUTPUT |
| 24/120 | 100000101000 | 216 | 100010001001 | 216 | 001000100001 | 24/120 | 000101000100 |
| 25/121 | 100000101010 | 217 | 100010010001 | 217 | 001000100101 | 25/121 | 000101001000 |
| 26/122 | 100001000000 | 218 | 100010010101 | 218 | 001000101001 | 26/122 | 000101001010 |
| 27/123 | 100001000010 | 219 | 100010100001 | 219 | 001001000001 | 27/123 | 000101010000 |
| 28/124 | 100001000100 | 220 | 100010100101 | 220 | 001001000101 | 28/124 | 000101010010 |
| 29/125 | 100001001000 | 221 | 100010101001 | 221 | 001001001001 | 29/125 | 000101010100 |
| 30/126 | 100001001010 | 222 | 100100001001 | 222 | 001001010001 | 30/126 | 001000000010 |
| 31/127 | 100001010000 | 223 | 100100000101 | 223 | 001001010101 | 31/127 | 001000000100 |
| 32/128 | 100001010010 | 224 | 100100001001 | 224 | 001010000001 | 32/128 | 001000001000 |
| 33/129 | 100001010100 | 225 | 100100010001 | 225 | 001010000101 | 33/129 | 001000001010 |
| 34/130 | 100010000010 | 226 | 100100010101 | 226 | 001010001001 | 34/130 | 001000010000 |
| 35/131 | 100010000100 | 227 | 100100100001 | 227 | 001010010001 | 35/131 | 001000010010 |
| 36/132 | 100010001000 | 228 | 100100100101 | 228 | 001010010101 | 36/132 | 001000010100 |
| 37/133 | 100010001010 | 229 | 100100101001 | 229 | 001010100001 | 37/133 | 001000100000 |
| 38/134 | 100010010000 | 230 | 100101000101 | 230 | 001010100101 | 38/134 | 001000100010 |
| 39/135 | 100010010010 | 231 | 100101000101 | 231 | 001010101001 | 39/135 | 001000100100 |
| 40/136 | 100010010100 | 232 | 100101001001 | 232 | 010000000001 | 40/136 | 001000101000 |
| 41/137 | 100010100000 | 233 | 100101010001 | 233 | 010000000101 | 41/137 | 001000101010 |
| 42/138 | 100010100100 | 234 | 100101010101 | 234 | 010000001001 | 42/138 | 001001000010 |
| 43/139 | 100010101000 | 235 | 101000000001 | 235 | 010000010001 | 43/139 | 001001000100 |
| 44/140 | 100010101010 | 236 | 101000000101 | 236 | 010000010101 | 44/140 | 001001001000 |
| 45/141 | 100100000010 | 237 | 101000001001 | 237 | 010000100001 | 45/141 | 001001001010 |
| 46/142 | 100100000100 | 238 | 101000010001 | 238 | 010000100101 | 46/142 | 001001010000 |
| 47/143 | 100100001000 | 239 | 101000010101 | 239 | 010000101001 | 47/143 | 001001010010 |
| 48/144 | 100100001010 | 240 | 101000100001 | 240 | 010001000001 | 48/144 | 001001010100 |
| 49/145 | 100100010000 | 241 | 101000100101 | 241 | 010001000101 | 49/145 | 001010000010 |
| 50/146 | 100100010010 | 242 | 101000101001 | 242 | 010001001001 | 50/146 | 001010000100 |
| 51/147 | 100100010100 | 243 | 101001000101 | 243 | 010001010101 | 51/147 | 001010001000 |
| 52/148 | 100100100000 | 244 | 101001000101 | 244 | 010010000001 | 52/148 | 001010010000 |
| 53/149 | 100100100010 | 245 | 101001001001 | 245 | 010010000101 | 53/149 | 001010010010 |
| 54/150 | 100100100100 | 246 | 101001010001 | 246 | 010010001001 | 54/150 | 001010010100 |
| 55/151 | 100100101001 | 247 | 101001010101 | 247 | 010010010101 | 55/151 | 001010100000 |
| 56/152 | 100100101010 | 248 | 101010000001 | 248 | 010010010101 | 56/152 | 001010100010 |
| 57/153 | 100101000000 | 249 | 101010000101 | 249 | 010010100001 | 57/153 | 001010100100 |
| 58/154 | 100101000010 | 250 | 101010001001 | 250 | 010010100101 | 58/154 | 001010101000 |
| 59/155 | 100101000100 | 251 | 101010010001 | 251 | 010010101001 | 59/155 | 001010101010 |
| 60/156 | 100101001000 | 252 | 101010010101 | 252 | 010100000001 | 60/156 | 010000000010 |
| 61/157 | 100101001010 | 253 | 101010100001 | 253 | 010100000101 | 61/157 | 010000000100 |
| 62/158 | 100101010000 | 254 | 101010100101 | 254 | 010100001001 | 62/158 | 010000001000 |
| 63/159 | 100101010010 | 255 | 101010101001 | 255 | 010100010001 | 63/159 | 010000001010 |
| 64/160 | 100101010100 | | | | | 64/160 | 010000010000 |
| 65/161 | 101000000010 | | | | | 65/161 | 010000010010 |
| 66/162 | 101000000100 | | | | | 66/162 | 010000010100 |
| 67/163 | 101000001000 | | | | | 67/163 | 010000100000 |
| 68/164 | 101000001010 | | | | | 68/164 | 010000100010 |
| 69/165 | 101000010000 | | | | | 69/165 | 010000100100 |
| 70/166 | 101000010010 | | | | | 70/166 | 010000101000 |
| 71/167 | 101000010100 | | | | | 71/167 | 010000101010 |
| 72/168 | 101000100000 | | | | | 72/168 | 010001000010 |
| 73/169 | 101000100010 | | | | | 73/169 | 010001000100 |
| 74/170 | 101000100100 | | | | | 74/170 | 010001001000 |
| 75/171 | 101000101010 | | | | | 75/171 | 010001001010 |
| 76/172 | 101001000000 | | | | | 76/172 | 010001010000 |
| 77/173 | 101001000010 | | | | | 77/173 | 010001010010 |
| 78/174 | 101001000100 | | | | | 78/174 | 010001010100 |
| 79/175 | 101001001000 | | | | | 79/175 | 010010000010 |
| 80/176 | 101001001010 | | | | | 80/176 | 010010000100 |
| 81/177 | 101001010000 | | | | | 81/177 | 010010001000 |
| 82/178 | 101001010010 | | | | | 82/178 | 010010001010 |
| 83/179 | 101001010100 | | | | | 83/179 | 010010010000 |
| 84/180 | 101010000010 | | | | | 84/180 | 010010010100 |
| 85/181 | 101010000100 | | | | | 85/181 | 010010010100 |
| 86/182 | 101010001000 | | | | | 86/182 | 010010100000 |
| 87/183 | 101010001010 | | | | | 87/183 | 010010100010 |
| 88/184 | 101010010000 | | | | | 88/184 | 010010100100 |
| 89/185 | 101010010010 | | | | | 89/185 | 010010101000 |
| 90/186 | 101010010100 | | | | | 90/186 | 010010101010 |
| 91/187 | 101010100000 | | | | | 91/187 | 010100000010 |
| 92/188 | 101010100010 | | | | | 92/188 | 010100000100 |
| 93/189 | 101010100100 | | | | | 93/189 | 010100001000 |
| 94/190 | 101010101000 | | | | | 94/190 | 010100001010 |
| 95/191 | 101010101010 | | | | | 95/191 | 010100010000 |

Figure 11:
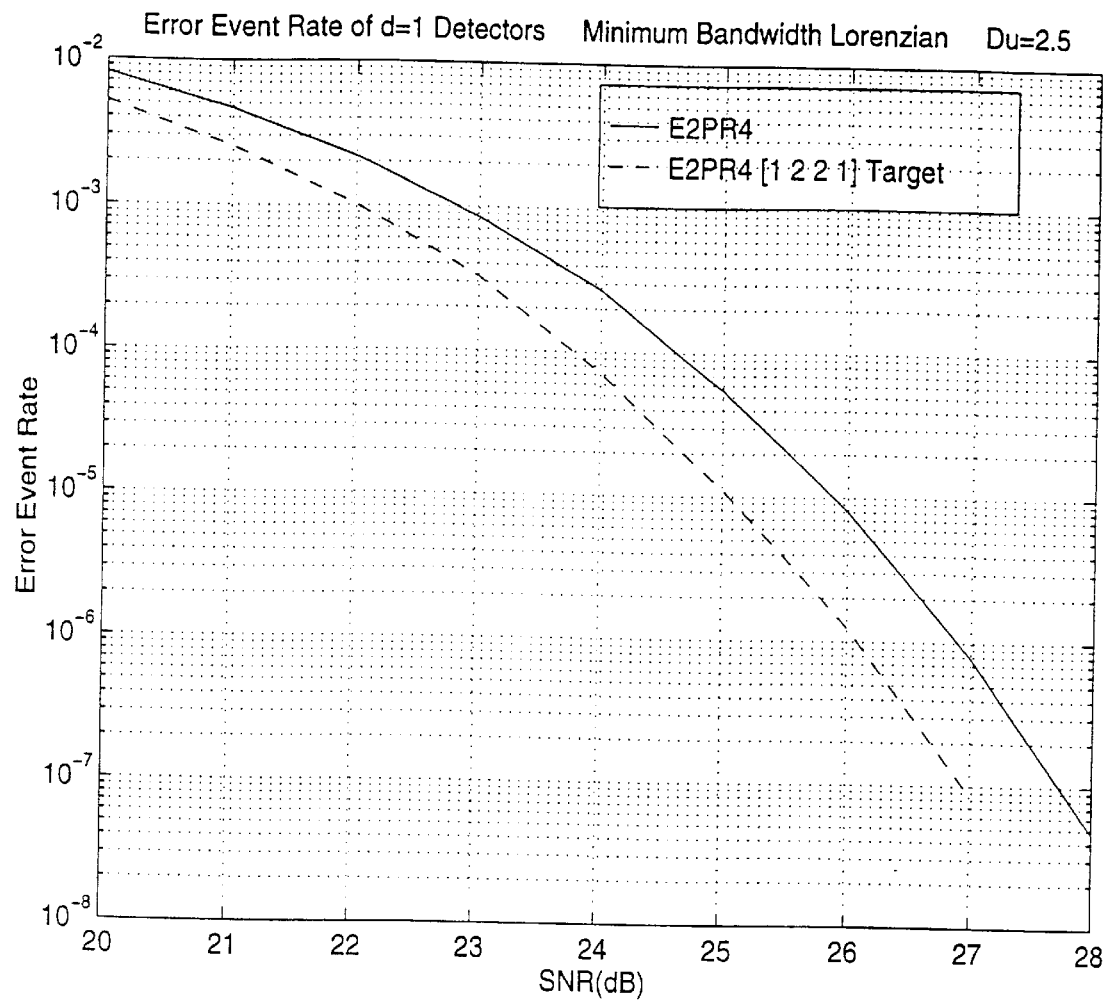
FIG. 11 is a graph that illustrates the performance gain provided by the sampled amplitude MEEPR4 read channel of the present invention over a conventional EEPR4 read channel.

The performance gain provided by the present invention is illustrated in FIG. 11. Notice that the MEEPR4 read channel employing the channel code of the present invention provides approximately one db gain over a conventional EEPR4 read channel. As mentioned above, the performance gain stems from the MEEPR4 channel attenuating the (+00+) NRZ error event at higher linear densities, and attenuating equalizer noise in matching the recording channel to the MEEPR4 response. Further, the (2,4,2) constraint prevents quasi-catastrophic error events, and the RLL d=1 constraint provides coding gain by coding out the minimum distance error events associated with the MEEPR4 sequence detector.

Thus, the objects of the invention have been fully realized through the embodiments disclosed herein. Those skilled in the art will appreciate that the various aspects of the invention can be achieved through different embodiments without departing from the essential function. For example, those skilled in the art will appreciate that code rates other than 6/9 and 8/12 could be employed to implement the code constraints of the present invention. The particular embodiments disclosed are illustrative and not meant to limit the scope of the invention as appropriately construed from the following claims.

I claim:

1. A sampled amplitude read/write channel for writing user data to a disk storage medium and reading the user data from the disk storage medium, comprising:

(a) an encoder for encoding the user data into a write sequence according to a (2,4,2) NRZ constraint to code out (2,4,2) data sequences;
  (b) write circuitry for writing the write sequence to the disk storage medium;
  (c) a sampling device for sampling an analog read signal to generate a sequence of discrete-time sample values;
  (d) a discrete-time sequence detector for detecting an estimated data sequence from the equalized sample values; and
  (e) a decoder for decoding the estimated data sequence into estimated user data.

2. The sampled amplitude read/write channel as recited in claim 1, wherein the encoder encodes the user data such that the write sequence comprises a run-length limited (RLL) d constraint where d>0.

3. The sampled amplitude read/write channel as recited in claim 1, wherein the encoder encodes the user data such that the write sequence comprises an RLL k constraint where k<11.

4. The sampled amplitude read/write channel as recited in claim 1, wherein the encoder encodes n bits of user data into m bits of write sequence where n/m equals 2/3.

5. The sampled amplitude read/write channel as recited in claim 1, wherein the encoder comprises:

(a) a plurality of mapping circuits wherein each mapping circuit maps n bits of user data into m bits of mapped data to thereby generate a plurality of mapped data symbols;
  (b) a state generator, responsive to the n bits of user data and a previous state signal, for generating a current state signal; and
  (c) a selection circuit, responsive to the mapped data symbols and the current state signal, for selecting one of the mapped data symbols to generate the write sequence.

6. The sampled amplitude read/write channel as recited in claim 5, wherein the encoder operates according to a finite state transition diagram comprising

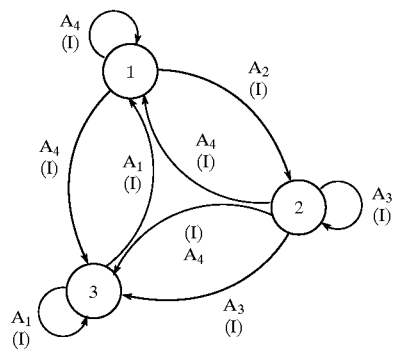

where I of a state branch label represents the n bits of user is data and $A_1$–$A_4$ represents four mapping circuits.

7. The sampled amplitude read/write channel as recited in claim 1, wherein the encoder operates according to a finite state transition diagram comprising

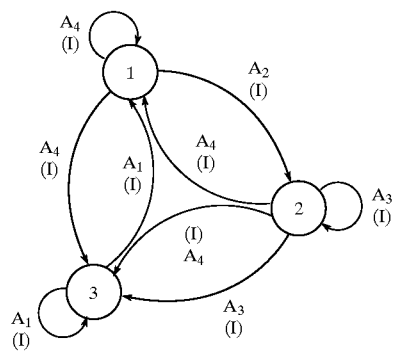

where I of a state branch label represents n bits of user data and $A_1$–$A_4$ represents four distinct mappings of the n bits of user data into m bits of mapped data.

8. The sampled amplitude read/write channel as recited in claim 7, wherein the finite state transition diagram comprises

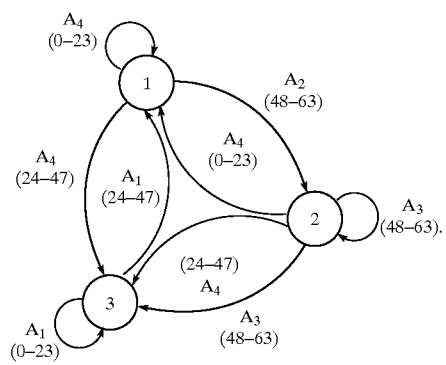

9. The sampled amplitude read channel as recited in claim 8, wherein the four distinct mappings $A_1$–$A_4$ are

| A₁ | | A₂ | | A₃ | | A₄ | |
|---|---|---|---|---|---|---|---|
| INPUT | OUTPUT | INPUT | OUTPUT | INPUT | OUTPUT | INPUT | OUTPUT |
| 00/24 | 002 | 48 | 001 | 48 | 021 | 00/24 | 012 |
| 01/25 | 004 | 49 | 005 | 49 | 025 | 01/25 | 020 |
| 02/26 | 010 | 50 | 011 | 50 | 041 | 02/26 | 022 |
| 03/27 | 400 | 51 | 111 | 51 | 045 | 03/27 | 024 |
| 04/28 | 402 | 52 | 401 | 52 | 051 | 04/28 | 040 |
| 05/29 | 404 | 53 | 405 | 53 | 101 | 05/29 | 042 |
| 06/30 | 410 | 54 | 411 | 54 | 105 | 06/30 | 044 |
| 07/31 | 412 | 55 | 421 | 55 | 125 | 07/31 | 052 |
| 08/32 | 420 | 56 | 425 | 56 | 201 | 08/32 | 102 |
| 09/33 | 422 | 57 | 441 | 57 | 205 | 09/33 | 104 |
| 10/34 | 440 | 58 | 445 | 58 | 211 | 10/34 | 110 |
| 11/35 | 442 | 59 | 451 | 59 | 221 | 11/35 | 112 |
| 12/36 | 444 | 60 | 501 | 60 | 225 | 12/36 | 120 |
| 13/37 | 450 | 61 | 511 | 61 | 241 | 13/37 | 122 |
| 14/38 | 452 | 62 | 521 | 62 | 245 | 14/38 | 124 |
| 15/39 | 500 | 63 | 525 | 63 | 251 | 15/39 | 202 |
| 16/40 | 502 | | | | | 16/40 | 204 |
| 17/41 | 504 | | | | | 17/41 | 210 |
| 18/42 | 510 | | | | | 18/42 | 220 |
| 19/43 | 512 | | | | | 19/43 | 224 |
| 20/44 | 520 | | | | | 20/44 | 240 |
| 21/45 | 522 | | | | | 21/45 | 244 |
| 22/46 | 524 | | | | | 22/46 | 250 |
| 23/47 | 000 | | | | | 23/47 | 252. |

10. The sampled amplitude read/write channel as recited in claim 7, wherein the finite state transition diagram comprises

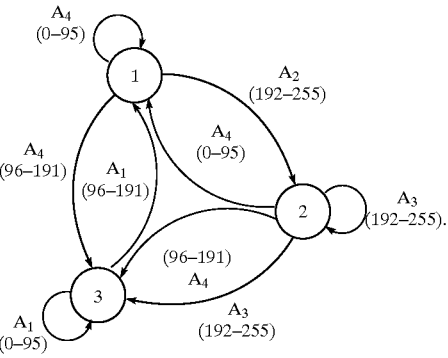

11. The sampled amplitude read/write channel as recited in claim 10, wherein the four distinct mappings $A_1$–$A_4$ are

| A₁ | | A₂ | | A₃ | | A₄ | |
|---|---|---|---|---|---|---|---|
| INPUT | OUTPUT | INPUT | OUTPUT | INPUT | OUTPUT | INPUT | OUTPUT |
| 0/96 | 010100010010 | 192 | 010100010101 | 192 | 000010000101 | 0/96 | 000010000100 |
| 1/97 | 010100100000 | 193 | 010100100001 | 193 | 000010001001 | 1/97 | 000010001000 |
| 2/98 | 010100100010 | 194 | 010100100101 | 194 | 000010010001 | 2/98 | 000010001010 |
| 3/99 | 010100100100 | 195 | 010100101001 | 195 | 000010010101 | 3/99 | 000010010000 |
| 4/100 | 010100101000 | 196 | 010101000001 | 196 | 000010100001 | 4/100 | 000010010010 |
| 5/101 | 010100101010 | 197 | 010101000101 | 197 | 000010100101 | 5/101 | 000010010100 |
| 6/102 | 010101000000 | 198 | 010101001001 | 198 | 000010101001 | 6/102 | 000010100000 |
| 7/103 | 010101000010 | 199 | 010101010001 | 199 | 000100000001 | 7/103 | 000010100010 |
| 8/104 | 010101000100 | 200 | 010101010101 | 200 | 000100000101 | 8/104 | 000010100100 |
| 9/105 | 010101001000 | 201 | 100000000001 | 201 | 000100001001 | 9/105 | 000010101000 |
| 10/106 | 010101001010 | 202 | 100000000101 | 202 | 000100010001 | 10/106 | 000010101010 |
| 11/107 | 010101010000 | 203 | 100000001001 | 203 | 000100010101 | 11/107 | 000100000010 |
| 12/108 | 010101010010 | 204 | j00000010001 | 204 | 000100100001 | 12/108 | 000100000100 |
| 13/109 | 010101010100 | 205 | 100000010101 | 205 | 000100100101 | 13/109 | 000100001000 |
| 14/110 | 100000000010 | 206 | 100000100001 | 206 | 000100101001 | 14/110 | 000100001010 |
| 15/111 | 100000000100 | 207 | 100000100101 | 207 | 000101000001 | 15/111 | 000100010000 |
| 16/112 | 100000001000 | 208 | 100000101001 | 208 | 000101001001 | 16/112 | 000100010010 |

-continued

| A₁ | | A₂ | | A₃ | | A₄ | |
|---|---|---|---|---|---|---|---|
| INPUT | OUTPUT | INPUT | OUTPUT | INPUT | OUTPUT | INPUT | OUTPUT |
| 17/113 | 100000001010 | 209 | 100001000001 | 209 | 000101010001 | 17/113 | 000100010100 |
| 18/114 | 100000010000 | 210 | 100001000101 | 210 | 000101010101 | 18/114 | 000100100000 |
| 19/115 | 100000010001 | 211 | 100001001001 | 211 | 00100000001 | 19/115 | 000100100010 |
| 20/116 | 100000010010 | 212 | 100001010001 | 212 | 001000000101 | 20/116 | 000100100100 |
| 21/117 | 100000100000 | 213 | 100001010101 | 213 | 001000001001 | 21/117 | 000100101000 |
| 22/118 | 100000100010 | 214 | 100010000001 | 214 | 001000010001 | 22/118 | 000100101010 |
| 23/119 | 100000100100 | 215 | 100010000101 | 215 | 001000010101 | 23/119 | 000101000010 |
| 24/120 | 100000101000 | 216 | 100010001001 | 216 | 001000100001 | 24/120 | 000101000100 |
| 25/121 | 100000101010 | 217 | 100010010001 | 217 | 001000100101 | 25/121 | 000101001000 |
| 26/122 | 100001000000 | 218 | 100010010101 | 218 | 001000101001 | 26/122 | 000101001010 |
| 27/123 | 100001000010 | 219 | 100010100001 | 219 | 001001000001 | 27/123 | 000101010000 |
| 28/124 | 100001000100 | 220 | 100010100101 | 220 | 001001000101 | 28/124 | 000101010010 |
| 29/125 | 100001001000 | 221 | 100010101001 | 221 | 001001001001 | 29/125 | 000101010100 |
| 30/126 | 100001001010 | 222 | 100100000001 | 222 | 001001010001 | 30/126 | 001000000010 |
| 31/127 | 100001010000 | 223 | 100100000101 | 223 | 001001010101 | 31/127 | 001000000100 |
| 32/128 | 100001010010 | 224 | 100100001001 | 224 | 001010000001 | 32/128 | 001000001000 |
| 33/129 | 100001010100 | 225 | 100100010001 | 225 | 001010000101 | 33/129 | 001000001010 |
| 34/130 | 100010000010 | 226 | 100100010101 | 226 | 001010001001 | 34/130 | 001000010000 |
| 35/131 | 100010000100 | 227 | 100100100001 | 227 | 001010010001 | 35/131 | 001000010010 |
| 36/132 | 100010001000 | 228 | 100100100101 | 228 | 001010010101 | 36/132 | 001000010100 |
| 37/133 | 100010001010 | 229 | 100100101001 | 229 | 001010100001 | 37/133 | 001000100000 |
| 38/134 | 100010010000 | 230 | 100101000001 | 230 | 001010100101 | 38/134 | 001000100010 |
| 39/135 | 100010010010 | 231 | 100101000101 | 231 | 001010101001 | 39/135 | 001000100100 |
| 40/136 | 100010010100 | 232 | 100101001001 | 232 | 010000000001 | 40/136 | 001000101000 |
| 41/137 | 100010100000 | 233 | 100101010001 | 233 | 010000000101 | 41/137 | 001000101010 |
| 42/138 | 100010100100 | 234 | 100101010101 | 234 | 010000001001 | 42/138 | 001001000010 |
| 43/139 | 100010101000 | 235 | 100101010101 | 235 | 010000010001 | 43/139 | 001001000100 |
| 44/140 | 100010101010 | 236 | 101000000101 | 236 | 010000010101 | 44/140 | 001001001000 |
| 45/141 | 100100000010 | 237 | 101000001001 | 237 | 010000100001 | 45/141 | 001001001010 |
| 46/142 | 100100000100 | 238 | 101000010001 | 238 | 010000100101 | 46/142 | 001001010000 |
| 47/143 | 100100001000 | 239 | 101000010101 | 239 | 010000101001 | 47/143 | 001001010010 |
| 48/144 | 100100001010 | 240 | 101000100001 | 240 | 010001000001 | 48/144 | 001001010100 |
| 49/145 | 100100010000 | 241 | 101000100101 | 241 | 010001000101 | 49/145 | 001010000010 |
| 50/146 | 100100010010 | 242 | 101000101001 | 242 | 010001001001 | 50/146 | 001010000100 |
| 51/147 | 100100010100 | 243 | 101001000001 | 243 | 010001010101 | 51/147 | 001010001000 |
| 52/148 | 100100100000 | 244 | 101001000101 | 244 | 010010000001 | 52/148 | 001010001010 |
| 53/149 | 100100100010 | 245 | 101001001001 | 245 | 010010000101 | 53/149 | 001010010010 |
| 54/150 | 100100100100 | 246 | 101001010001 | 246 | 010010001001 | 54/150 | 001010010100 |
| 55/151 | 100100101000 | 247 | 101001010101 | 247 | 010010010001 | 55/151 | 001010100000 |
| 56/152 | 100100101010 | 248 | 101010000001 | 248 | 010010010101 | 56/152 | 001010100010 |
| 57/153 | 100101000000 | 249 | 101010000101 | 249 | 010010100001 | 57/153 | 001010100100 |
| 58/154 | 100101000010 | 250 | 101010001001 | 250 | 010010100101 | 58/154 | 001010101000 |
| 59/155 | 100101000100 | 251 | 101010010001 | 251 | 010010101001 | 59/155 | 001010101010 |
| 60/156 | 100101001001 | 252 | 101010010101 | 252 | 010100000001 | 60/156 | 010000000010 |
| 61/157 | 100101001010 | 253 | 101010100001 | 253 | 010100000101 | 61/157 | 010000000100 |
| 62/158 | 100101010000 | 254 | 101010100101 | 254 | 010100001001 | 62/158 | 010000001000 |
| 63/159 | 100101010010 | 255 | 101010101001 | 255 | 010100010001 | 63/159 | 010000001010 |
| 64/160 | 100101010100 | | | | | 64/160 | 010000010000 |
| 65/161 | 101000000010 | | | | | 65/161 | 010000010010 |
| 66/162 | 101000000100 | | | | | 66/162 | 010000010100 |
| 67/163 | 101000001000 | | | | | 67/163 | 010000100000 |
| 68/164 | 101000001010 | | | | | 68/164 | 010000100010 |
| 69/165 | 101000010000 | | | | | 69/165 | 010000100100 |
| 70/166 | 101000010010 | | | | | 70/166 | 010000101000 |
| 71/167 | 101000010100 | | | | | 71/167 | 010000101010 |
| 72/168 | 101000100000 | | | | | 72/168 | 010001000010 |
| 73/169 | 101000100010 | | | | | 73/169 | 010001000100 |
| 74/170 | 101000100100 | | | | | 74/170 | 010001001000 |
| 75/171 | 101000101010 | | | | | 75/171 | 010001001010 |
| 76/172 | 101001000000 | | | | | 76/172 | 010001010000 |
| 77/173 | 101001000010 | | | | | 77/173 | 010001010010 |
| 78/174 | 101001000100 | | | | | 78/174 | 010001010100 |
| 79/175 | 101001001000 | | | | | 79/175 | 010010000010 |
| 80/176 | 101001001010 | | | | | 80/176 | 010010000100 |
| 81/177 | 101001010000 | | | | | 81/177 | 010010001000 |
| 82/178 | 101001010010 | | | | | 82/178 | 010010001010 |
| 83/179 | 101001010100 | | | | | 83/179 | 010010010000 |
| 84/180 | 101010000010 | | | | | 84/180 | 010010010010 |
| 85/181 | 101010000100 | | | | | 85/181 | 010010010100 |
| 86/182 | 101010001001 | | | | | 86/182 | 010010100000 |
| 87/183 | 101010001010 | | | | | 87/183 | 010010100010 |
| 88/184 | 101010010000 | | | | | 88/184 | 010010100100 |
| 89/185 | 101010010010 | | | | | 89/185 | 010010101000 |
| 90/186 | 101010010100 | | | | | 90/186 | 010010101010 |
| 91/187 | 101010100000 | | | | | 91/187 | 010100000010 |

-continued

| A$_1$ | | A$_2$ | | A$_3$ | | A$_4$ | |
|---|---|---|---|---|---|---|---|
| INPUT | OUTPUT | INPUT | OUTPUT | INPUT | OUTPUT | INPUT | OUTPUT |
| 92/188 | 101010100010 | | | | | 92/188 | 010100000100 |
| 93/189 | 101010100100 | | | | | 93/189 | 010100001000 |
| 94/190 | 101010101000 | | | | | 94/190 | 010100001010 |
| 95/191 | 101010101010 | | | | | 95/191 | 010100010000. |

12. The sampled amplitude read/write channel as recited in claim 1, wherein the decoder comprises:

(a) an input connected to receive m bits of estimated data sequence;

(b) a storage element for storing the m bits of estimated data sequence;

(c) a state generator, responsive to the m bits of estimated data sequence at the input of the encoder, for generating a current state signal; and (d) a mapping circuit, responsive to the m bits of estimated data sequence stored in the storage element and to the current state signal, for mapping the m bits of estimated data sequence into n bits of the estimated user data.

13. The sampled amplitude read/write channel as recited in claim 12, wherein:

(a) the mapping circuit comprises a plurality of lookup tables;

(b) each lookup table maps m bits of estimated data sequence into n bits of mapped data; and (c) the current state signal selects one of the lookup tables for generating the n bits of estimated user data.

14. The sampled amplitude read/write channel as recited in claim 1, wherein the discrete-time sequence detector operates according to a state transition diagram comprising:

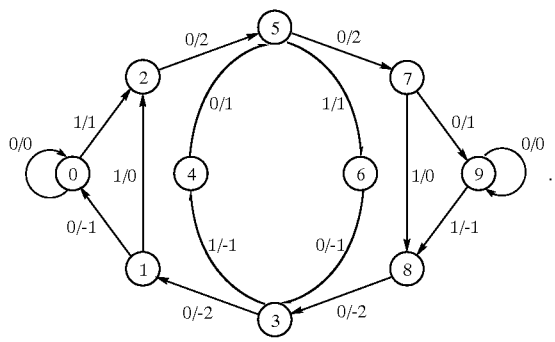

15. A sampled amplitude read channel for detecting data recorded on a disk storage medium, the recorded data having been encoded into a write sequence according to a (2,4,2) NRZ constraint to code out (2,4.2) data sequences, the read channel comprising:

(a) a sampling device for sampling an analog read signal to generate a sequence of discrete-time sample values;

(b) a discrete-time equalizer for equalizing the sample values according to a dipulse response substantially of the form (+1, +1, 0, −1, −1)

to generate equalized sample values;

(c) a discrete-time sequence detector for detecting an estimated data sequence from the equalized sample values; and (d) a decoder for decoding the estimated data sequence into estimated user data.

16. The sampled amplitude read channel as recited in claim 15, wherein the recorded data comprises a run-length limited (RLL) d constraint where d>0.

17. The sampled amplitude read channel as recited in claim 15, wherein the recorded data comprises an RLL k constraint where k<11.

18. The sampled amplitude read channel as recited in claim 15, wherein the recorded data is encoded according to a channel code comprising a code rate of 2/3.

19. The sampled amplitude read channel as recited in claim 15, wherein the recorded data is encoded according to a finite state transition diagram comprising

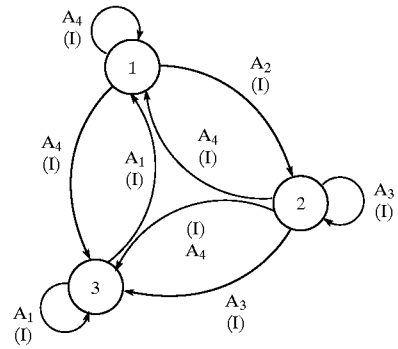

where I of a state branch label represents n bits of user data and A$_1$–A$_4$ represents four distinct mappings of n bits of user data into m bits of mapped data.

20. The sampled amplitude read channel as recited in claim 19, wherein:

(a) the decoder comprises four mapping circuits $\overline{A}_1$–$\overline{A}_4$ for performing the inverse mapping of the A$_1$–A$_4$ mapping; and (b) the decoder decodes the estimated data sequence into the estimated user data according to the following table

| Next Codeword | Current Codeword | Decoding Table |
|---|---|---|
| A$_1$, A$_3$ | A$_1$ | $\overline{A}_1$—>(I) |
| A$_4$, A$_2$ | A$_1$ | $\overline{A}_1$—>(I) |
| A$_4$, A$_2$ | A$_4$ | $\overline{A}_4$—>(I) |
| A$_1$, A$_3$ | A$_4$ | $\overline{A}_4$—>(I) |
| XX | A$_2$ | $\overline{A}_2$—>(I) |
| XX | A$_3$ | $\overline{A}_3$—>(I) | where (I) in the above table denotes a plurality of decoded codewords, and X denotes a don't care.

21. The sampled amplitude read channel as recited in claim 19, wherein the finite state transition diagram comprises

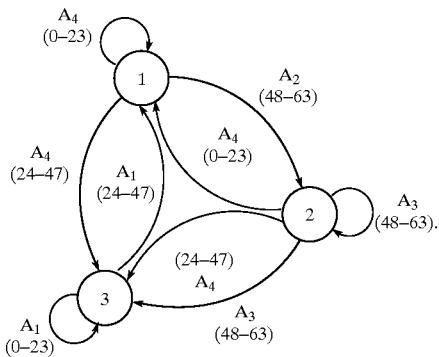

22. The sampled amplitude read channel as recited in claim 21, wherein the four distinct mappings $A_1$–$A_4$ are 23. The sampled amplitude read channel as recited in claim 19, wherein the finite state transition diagram comprises

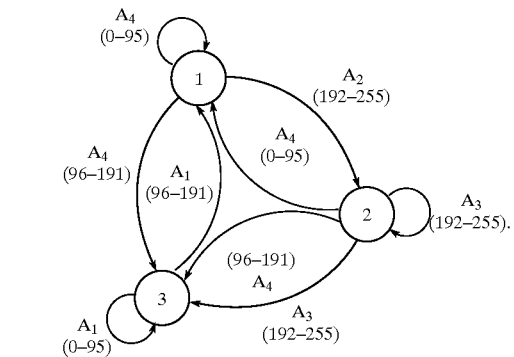

24. The sampled amplitude read channel as recited in claim 23, wherein the four distinct mappings $A_1$–$A_4$ are

| $A_1$ | | $A_2$ | | $A_3$ | | $A_4$ | |
|---|---|---|---|---|---|---|---|
| INPUT | OUTPUT | INPUT | OUTPUT | INPUT | OUTPUT | INPUT | OUTPUT |
| 00/24 | 002 | 48 | 001 | 48 | 021 | 00/24 | 012 |
| 01/25 | 004 | 49 | 005 | 49 | 025 | 01/25 | 020 |
| 02/26 | 010 | 50 | 011 | 50 | 041 | 02/26 | 022 |
| 03/27 | 400 | 51 | 111 | 51 | 045 | 03/27 | 024 |
| 04/28 | 402 | 52 | 401 | 52 | 051 | 04/28 | 040 |
| 05/29 | 404 | 53 | 405 | 53 | 101 | 05/29 | 042 |
| 06/30 | 410 | 54 | 411 | 54 | 105 | 06/30 | 044 |
| 07/31 | 412 | 55 | 421 | 55 | 125 | 07/31 | 052 |
| 08/32 | 420 | 56 | 425 | 56 | 201 | 08/32 | 102 |
| 09/33 | 422 | 57 | 441 | 57 | 205 | 09/33 | 104 |
| 10/34 | 440 | 58 | 445 | 58 | 211 | 10/34 | 110 |
| 11/35 | 442 | 59 | 451 | 59 | 221 | 11/35 | 112 |
| 12/36 | 444 | 60 | 501 | 60 | 225 | 12/36 | 120 |
| 13/37 | 450 | 61 | 511 | 61 | 241 | 13/37 | 122 |
| 14/38 | 452 | 62 | 521 | 62 | 245 | 14/38 | 124 |
| 15/39 | 500 | 63 | 525 | 63 | 251 | 15/39 | 202 |
| 16/40 | 502 | | | | | 16/40 | 204 |
| 17/41 | 504 | | | | | 17/41 | 210 |
| 18/42 | 510 | | | | | 18/42 | 220 |
| 19/43 | 512 | | | | | 19/43 | 224 |
| 20/44 | 520 | | | | | 20/44 | 240 |
| 21/45 | 522 | | | | | 21/45 | 244 |
| 22/46 | 524 | | | | | 22/46 | 250 |
| 23/47 | 000 | | | | | 23/47 | 252. |

| A₁ | | A₂ | | A₃ | | A₄ | |
|---|---|---|---|---|---|---|---|
| INPUT | OUTPUT | INPUT | OUTPUT | INPUT | OUTPUT | INPUT | OUTPUT |
| 0/96 | 010100010010 | 192 | 010100010101 | 192 | 000010000101 | 0/96 | 000010000100 |
| 1/97 | 010100100000 | 193 | 010100100001 | 193 | 000010001001 | 1/97 | 000010001000 |
| 2/98 | 010100100010 | 194 | 010100100101 | 194 | 000010010001 | 2/98 | 000010001010 |
| 3/99 | 010100100100 | 195 | 010100101001 | 195 | 000010010101 | 3/99 | 000010010000 |
| 4/100 | 010100101000 | 196 | 010101000001 | 196 | 000010100001 | 4/100 | 000010010010 |
| 5/101 | 010100101010 | 197 | 010101000101 | 197 | 000010100101 | 5/101 | 000010010100 |
| 6/102 | 010101000010 | 198 | 010101001001 | 198 | 000010101001 | 6/102 | 000010100000 |
| 7/103 | 010101000100 | 199 | 010101010001 | 199 | 000100000001 | 7/103 | 000010100010 |
| 8/104 | 010101000100 | 200 | 010101010101 | 200 | 000100000101 | 8/104 | 000010100100 |
| 9/105 | 010101001000 | 201 | 100000000001 | 201 | 000100001001 | 9/105 | 000010101000 |
| 10/106 | 010101001001 | 202 | 100000000101 | 202 | 000100010001 | 10/106 | 000010101010 |
| 11/107 | 010101010010 | 203 | 100000001001 | 203 | 000100010101 | 11/107 | 000100000010 |
| 12/108 | 010101010010 | 204 | 100000010001 | 204 | 000100100001 | 12/108 | 000100000100 |
| 13/109 | 010101010100 | 205 | 100000010101 | 205 | 000100100101 | 13/109 | 000100001000 |
| 14/110 | 100000000001 | 206 | 100000100001 | 206 | 000100101001 | 14/110 | 000100001010 |
| 15/111 | 100000000100 | 207 | 100000100101 | 207 | 000101000001 | 15/111 | 000100010000 |
| 16/112 | 100000001000 | 208 | 100000101001 | 208 | 000101001001 | 16/112 | 000100010010 |
| 17/113 | 100000001010 | 209 | 100001000001 | 209 | 000101010001 | 17/113 | 000100010100 |
| 18/114 | 100000010000 | 210 | 100001000101 | 210 | 000101010101 | 18/114 | 000100100000 |
| 19/115 | 100000010010 | 211 | 100001001001 | 211 | 001000000001 | 19/115 | 000100100010 |
| 20/116 | 100000010100 | 212 | 100001010001 | 212 | 001000000101 | 20/116 | 000100100100 |
| 21/117 | 100000100000 | 213 | 100001010101 | 213 | 001000001001 | 21/117 | 000100101000 |
| 22/118 | 100000100010 | 214 | 100010000001 | 214 | 001000010001 | 22/118 | 000100101010 |
| 23/119 | 100000100100 | 215 | 100010000101 | 215 | 001000010101 | 23/119 | 000101000010 |
| 24/120 | 100000101000 | 216 | 100010001001 | 216 | 001000100001 | 24/120 | 000101000100 |
| 25/121 | 100000101010 | 217 | 100010010001 | 217 | 001000100101 | 25/121 | 000101001000 |
| 26/122 | 100001000000 | 218 | 100010010101 | 218 | 001000101001 | 26/122 | 000101001010 |
| 27/123 | 100001000010 | 219 | 100010100001 | 219 | 001001000001 | 27/123 | 000101010000 |
| 28/124 | 100001000100 | 220 | 100010100101 | 220 | 001001000101 | 28/124 | 000101010010 |
| 29/125 | 100001001000 | 221 | 100010101001 | 221 | 001001001001 | 29/125 | 000101010100 |
| 30/126 | 100001001010 | 222 | 100100000001 | 222 | 001001010001 | 30/126 | 001000000010 |
| 31/127 | 100001010010 | 223 | 100100001010 | 223 | 001001010101 | 31/127 | 001000000100 |
| 32/128 | 100001010010 | 224 | 100100001001 | 224 | 001010000001 | 32/128 | 001000001000 |
| 33/129 | 100001010100 | 225 | 100100010001 | 225 | 001010000101 | 33/129 | 001000001010 |
| 34/130 | 100010000010 | 226 | 100100010101 | 226 | 001010001001 | 34/130 | 001000010000 |
| 35/131 | 100010000100 | 227 | 100100100001 | 227 | 001010010001 | 35/131 | 001000010010 |
| 36/132 | 100010001000 | 228 | 100100100101 | 228 | 001010010101 | 36/132 | 001000010100 |
| 37/133 | 100010001010 | 229 | 100100101001 | 229 | 001010100001 | 37/133 | 001000100000 |
| 38/134 | 100010010000 | 230 | 100101000001 | 230 | 001010100101 | 38/134 | 001000100010 |
| 39/135 | 100010010010 | 231 | 100101010001 | 231 | 001010101001 | 39/135 | 001000100100 |
| 40/136 | 100010010100 | 232 | 100101001001 | 232 | 010000000001 | 40/136 | 001000101000 |
| 41/137 | 100010100000 | 233 | 100101010001 | 233 | 010000000101 | 41/137 | 001000101010 |
| 42/138 | 100010100100 | 234 | 100101010101 | 234 | 010000001001 | 42/138 | 001001000010 |
| 43/139 | 100010101001 | 235 | 101000000001 | 235 | 010000010001 | 43/139 | 001001000100 |
| 44/140 | 100010101010 | 236 | 101000000101 | 236 | 010000010101 | 44/140 | 001001001000 |
| 45/141 | 100100000010 | 237 | 101000001001 | 237 | 010000100001 | 45/141 | 001001001010 |
| 46/142 | 100100000100 | 238 | 101000010001 | 238 | 010000100101 | 46/142 | 001001010000 |
| 47/143 | 100100001000 | 239 | 101000010101 | 239 | 010000101001 | 47/143 | 001001010010 |
| 48/144 | 100100001001 | 240 | 101000100001 | 240 | 010001000001 | 48/144 | 001001010100 |
| 49/145 | 100100010010 | 241 | 101000100101 | 241 | 010001000101 | 49/145 | 001010000010 |
| 50/146 | 100100010010 | 242 | 101000101001 | 242 | 010001001001 | 50/146 | 001010000100 |
| S1/147 | 100100010100 | 243 | 101001000001 | 243 | 010001010101 | 51/147 | 001010001000 |
| 52/148 | 100100100000 | 244 | 101001000101 | 244 | 010010000001 | 52/148 | 001010001010 |
| 53/149 | 100100100010 | 245 | 101001001001 | 245 | 010010000101 | 53/149 | 001010010010 |
| 54/150 | 100100100100 | 246 | 101001010001 | 246 | 010010001001 | 54/150 | 001010010100 |
| 55/151 | 100100101000 | 247 | 101001010101 | 247 | 010010010001 | 55/151 | 001010100000 |
| 56/152 | 100100101010 | 248 | 101010000001 | 248 | 010010010101 | 56/152 | 001010100010 |
| 57/153 | 100101000000 | 249 | 101010000101 | 249 | 010010100001 | 57/153 | 001010100100 |
| 58/154 | 100101000010 | 250 | 101010001001 | 250 | 010010100101 | 58/154 | 001010101000 |
| 59/155 | 100101000100 | 251 | 101010010001 | 251 | 010010101001 | 59/155 | 001010101010 |
| 60/156 | 100101001001 | 252 | 101010010101 | 252 | 010100000001 | 60/156 | 010000000010 |
| 61/157 | 100101001010 | 253 | 101010100001 | 253 | 010100000101 | 61/157 | 010000000100 |
| 62/158 | 100101010000 | 254 | 101010100101 | 254 | 010100001001 | 62/158 | 010000001000 |
| 63/159 | 100101010010 | 255 | 101010101001 | 255 | 010100010001 | 63/159 | 010000001010 |
| 64/160 | 100101010100 | | | | | 64/160 | 010000010010 |
| 65/161 | 101000000010 | | | | | 65/161 | 010000010010 |
| 66/162 | 101000000100 | | | | | 66/162 | 010000010100 |
| 67/163 | 101000001000 | | | | | 67/163 | 010000100000 |
| 68/164 | 101000001010 | | | | | 68/164 | 010000100010 |
| 69/165 | 101000010000 | | | | | 69/165 | 010000100100 |
| 70/166 | 101000010010 | | | | | 70/166 | 010000101000 |
| 71/167 | 101000010100 | | | | | 71/167 | 010000101010 |
| 72/168 | 101000100000 | | | | | 72/168 | 010001000010 |
| 73/169 | 101000100010 | | | | | 73/169 | 010001000100 |
| 74/170 | 101000100100 | | | | | 74/170 | 010001001000 |

-continued

| A₁ | | A₂ | | A₃ | | A₄ | |
|---|---|---|---|---|---|---|---|
| INPUT | OUTPUT | INPUT | OUTPUT | INPUT | OUTPUT | INPUT | OUTPUT |
| 75/171 | 101000101010 | | | | | 75/171 | 010001001010 |
| 76/172 | 101001000000 | | | | | 76/172 | 010001010000 |
| 77/173 | 101001000010 | | | | | 77/173 | 010001010010 |
| 78/174 | 101001000100 | | | | | 78/174 | 010001010100 |
| 79/175 | 101001001000 | | | | | 79/175 | 010010000010 |
| 80/176 | 101001001010 | | | | | 80/176 | 010010000100 |
| 81/177 | 101001010000 | | | | | 81/177 | 010010001000 |
| 82/178 | 101001010010 | | | | | 82/178 | 010010001010 |
| 83/179 | 101001010100 | | | | | 83/179 | 010010010000 |
| 84/180 | 101010000010 | | | | | 84/180 | 010010010010 |
| 85/181 | 101010000100 | | | | | 85/181 | 010010010100 |
| 86/182 | 101010001000 | | | | | 86/182 | 010010100000 |
| 87/183 | 101010001010 | | | | | 87/183 | 010010100010 |
| 88/184 | 101010010000 | | | | | 88/184 | 010010100100 |
| 89/185 | 101010010010 | | | | | 89/185 | 010010101000 |
| 90/186 | 101010010100 | | | | | 90/186 | 010010101010 |
| 91/187 | 101010100000 | | | | | 91/187 | 010100000010 |
| 92/188 | 101010100010 | | | | | 92/188 | 010100000100 |
| 93/189 | 101010100100 | | | | | 93/189 | 010100001000 |
| 94/190 | 101010101000 | | | | | 94/190 | 010100001010 |
| 95/191 | 101010101010 | | | | | 95/191 | 010100010000. |

25. The sampled amplitude read channel as recited in claim 15, wherein the decoder comprises:

(a) an input connected to receive m bits of estimated data sequence;

(b) a storage element for storing the m bits of estimated data sequence;

(c) a state generator, responsive to the m bits of estimated data sequence at the input of the encoder, for generating a current state signal; and (d) a mapping circuit, responsive to the m bits of estimated data sequence stored in the storage element and to the current state signal, for mapping the m bits of estimated data sequence into n bits of the estimated user data.

26. The sampled amplitude read channel as recited in claim 25, wherein:

(a) the mapping circuit comprises a plurality of lookup tables;

(b) each lookup table maps m bits of estimated data sequence into n bits of mapped data; and (c) the current state signal selects one of the lookup tables for generating the n bits of estimated user data.

27. The sampled amplitude read channel as recited in claim 15, wherein the discrete-time sequence detector operates according to a state transition diagram comprising:

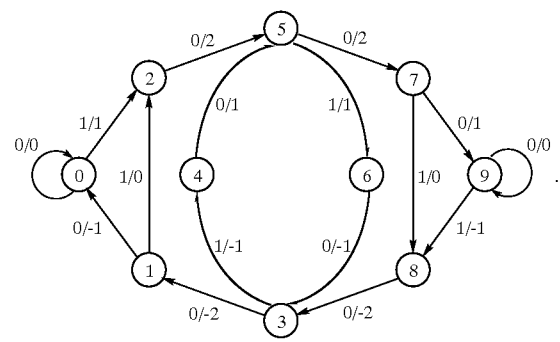

* * * * *